United States Patent
Venkatachary

(10) Patent No.: US 7,711,893 B1
(45) Date of Patent: May 4, 2010

(54) RANGE CODE COMPRESSION METHOD AND APPARATUS FOR TERNARY CONTENT ADDRESSABLE MEMORY (CAM) DEVICES

(75) Inventor: Srinivasan Venkatachary, Sunnyvale, CA (US)

(73) Assignee: Netlogic Microsystems, Inc., Mountain View, CA (US)

( * ) Notice: Subject to any disclaimer, the term of this patent is extended or adjusted under 35 U.S.C. 154(b) by 1055 days.

(21) Appl. No.: 10/897,062

(22) Filed: Jul. 22, 2004

(51) Int. Cl.
*G06F 12/00* (2006.01)
*G11C 15/00* (2006.01)

(52) U.S. Cl. .................. 711/108; 711/154; 365/49.1

(58) Field of Classification Search ............. 711/106
See application file for complete search history.

(56) References Cited

U.S. PATENT DOCUMENTS

| | | | |
|---|---|---|---|
| 5,848,435 A | 12/1998 | Brant et al. | |
| 6,181,592 B1 | 1/2001 | Aoki | |
| 6,266,262 B1 | 7/2001 | Washburn et al. | |
| 6,502,163 B1 * | 12/2002 | Ramankutty | 711/108 |
| 6,505,270 B1 | 1/2003 | Voelkel et al. | |
| 6,700,889 B1 | 3/2004 | Nun | |
| 2002/0056040 A1 * | 5/2002 | Simms | 713/171 |
| 2002/0191605 A1 * | 12/2002 | Lunteren et al. | 370/389 |
| 2003/0097605 A1 * | 5/2003 | Sharma et al. | 714/1 |
| 2004/0078516 A1 * | 4/2004 | Henderson et al. | 711/108 |
| 2005/0010719 A1 * | 1/2005 | Slavin | 711/108 |
| 2005/0018683 A1 * | 1/2005 | Zhao et al. | 370/393 |

OTHER PUBLICATIONS

U.S. Appl. No. 10/180,357, Chou.
U.S. Appl. No. 10/217,746, Chou.
"Algorithms for Advanced Packet Classification with Ternary CAMs," Lakshminarayanan et al., *ACM SIGCOMM '05*, Aug. 21-26, 2005, Philadelphia, Pennsylvania.
"Fast Scalable Level-Four Switching," Srinivasan et al., *ACM SIGCOMM Computer Communication Review*, 1998, vol. 28, Issue 4, pp. 191-202.

* cited by examiner

*Primary Examiner*—Matt Kim
*Assistant Examiner*—Michael C Krofcheck
(74) *Attorney, Agent, or Firm*—Haverstock & Owens, LLP

(57) ABSTRACT

A content addressable memory (CAM) device, method, and method of generating entries for range matching are disclosed. A CAM device (800) according to one embodiment can include a pre-encoder (806) that encodes range bit values W into additional bits E. Additional bits E can indicate compression of range rules according to particular bit pairs. A CAM array (802) can include entries that store compressed range code values (RANGE) with corresponding additional bit values (ENC). Alternate embodiments can include pre-encoders that encode portions of range values (K1 to Ki) in a "one-hot" fashion. Corresponding CAM entries can include encoded value having sections that each represent increasingly finer divisions of a range space.

20 Claims, 19 Drawing Sheets

| RANGE | ENCODING |
|---|---|
| >=0 | XX |
| >=1 | X1 |
| | 1X |
| >=2 | 1X |
| >=3 | 11 |

(CONVENTIONAL)

FIG. 1A

| RANGE | ENCODING a1,a0  L |
|---|---|
| >=0 | XX   X |
| >=1 | XX   1 |
| >=2 | 1X   X |
| >=3 | 11   X |

} LOW BOUND

FIG. 1B

| RANGE | ENCODING |
|---|---|
| <=3 | XX |
| <=2 | 0X |
| | X0 |
| <=1 | 0X |
| <=0 | 00 |

(CONVENTIONAL)

FIG. 2A

| RANGE | ENCODING a1,a0  H |
|---|---|
| <=3 | XX   X |
| <=2 | XX   1 |
| <=1 | 0X   X |
| <=0 | 00   X |

} HIGH BOUND

| CONVENTIONAL | |
|---|---|
| RANGE | PREFIX ENC. |
| 0 - 3 | 0-3    00XX |
| 1 - 6 | 1        0001 |
| | 2-3     001X |
| | 4-5     010X |
| | 6        0110 |
| 4 - 12 | 4-7     01XX |
| | 8-11   10XX |
| | 12      1100 |
| 6 - 14 | 6-7     011X |
| | 8-11   10XX |
| | 12-13 110X |
| | 14      1110 |
| 10 - 15 | 10-11 101X |
| | 12-15 11XX |

302

DIRPE (x2) NON-OVRLP
H1,H0
L1,L0

| 0 - 3 | 00XX  XX  XX |
|---|---|
| 1-3 | 00XX  X1  XX |
| 4-6 | 01XX  XX  X1 |
| 4-11 | XXXX  1X  1X |
| 12 | 1100  XX  XX |
| 6-7 | 011X  XX  XX |
| 8-11 | 10XX  XX  XX |
| 12-14 | 11XX  XX  X1 |
| 10-11 | 101X  XX  XX |
| 12-15 | 11XX  XX  XX |

304

DIRPE (x2) OVRLP
H2,H1,H0
L2,L1,L0

| 0 - 3 | 00XX  XXX  XXX |
|---|---|
| 1-5 | 0XXX  XX1  X1X |
| 6 | 0110  XXX  XXX |
| 4-11 | XXXX  1XX  1XX |
| 12 | 1100  XXX  XXX |
| 6-7 | 011X  XXX  XXX |
| 8-13 | 1XXX  XXX  X1X |
| 14 | 1110  XXX  XXX |
| 10-15 | 1XXX  X1X  XXX |

FIG. 3

```
/*© CYPRESS SEMICONDUCTOR CORPORATION 2004*/
int FindCombinableRanges (stackent *stk,  int n)
{
        int i,j, lastbit_i, lastbit_j, prevbit_j;
        stackent tmp;

for (i=0; (i<n); i++)
        {
                for (j=i+1; (j<n); j++)
                {
                        if (stk[j].mlen > stk[i].mlen) continue;
                        {
                                tmp = stk[j];
                                stk[j] = stk[i];
                                stk[i] = tmp;
                        }
                }
        } for (i=0; (i<n); i++)
        {
        for (j=0; (j<n); j++)
        {
                if (j==i) continue;

/*Prefix 'i' is considered the shorter one.
                A longer prefix 'j', such that i looks like 1*
                and j looks like 01* is found.*/
                if ( ( (stk[j].prfx>>(NUMB-stk[i].mlen+1) ==
(stk[i].prfx>>(NUMB-stk[i].mlen+1))
                        &&(stk[j].mlen == (stk[i].mlen+1)))))
                { lastbit_i = ((stk[i].prfx >> (NUMB - stk[i].mlen))
& 0x01);
                        lastbit_j = ((stk[j].prfx >> (NUMB - stk[j].mlen))
& 0x01);
                        prevbit_j = ((stk[j].prfx >> (NUMB - stk[i].mlen))
& 0x01);

if (( (lastbit_i==1) && (lastbit_j==1) &&
(prevbit_j==0) ) ||
                                ( (lastbit_i==0) && (lastbit_j==0) &&
(prevbit_j==1) ) )
                        { stk[j].num_aggr = 1+stk[i].num_aggr;

/* Scheme 1: In-array scheme.*/
                                /* Scheme 2: DIPC-W, with smaller prefix
                                corresponding to even length*/
                                /* Scheme 3: DIPC-W, with smaller prefix
                                corresponding to odd length*/
                                /* Scheme 4: DIPC-2W*/
                                stk[i].needed_s1 = 0;
```

/*© CYPRESS SEMICONDUCTOR CORPORATION 2004*/

```
                                if (stk[i].mlen % 2 == 0) stk[i].needed_s2 =
0;
                                if (stk[i].mlen % 2 == 1) stk[i].needed_s3 =
0;
                                if (stk[i].paired_2w == 0)
                                {
                                        /*If the smaller one has not already
                                        been paired up with a prefix above it,
                                        then it can be combined with the longer
                                        prefix using DIPC-2W*/
                                        stk[i].needed_s4 = 0;
                                        stk[j].paired_2w = 1;
                                }
                        }
                } /*Super netting*/

/*Sibling coalescing*/
                if ( ( (stk[j].prfx>>(NUMB-stk[i].mlen+2) ==
(stk[i].prfx>>(NUMB-stk[i].mlen+2))
                        &&(stk[j].mlen == (stk[i].mlen)) && (i<j))))
                {
                                                                                        404
                                /* Scheme 1: In-array scheme.*/
                                /* Scheme 2: DIPC-W, with smaller prefix
                                corresponding to even length*/
                                /* Scheme 3: DIPC-W, with smaller prefix
                                corresponding to odd length*/
                                /* Scheme 4: DIPC-2W*/
                                stk[i].needed_s4 = 0;

if (stk[i].mlen % 2 == 1) stk[i].needed_s2 =
0;
                                if (stk[i].mlen % 2 == 0) stk[i].needed_s3 =
0;
                                if (stk[i].paired_2w == 0)
                                {
                                        /*If the smaller one has not already
                                        been paired up with a prefix above it,
                                        then it can be combined with the longer
                                        prefix using DIPC-2W*/
                                        stk[i].needed_s4 = 0;
                                        stk[j].paired_2w = 1;
                                }
                } /*Sibling coalescing*/

}
        } return (1);
}
```

FIG. 4B (continued from FIG. 4A)

/*© CYPRESS SEMICONDUCTOR CORPORATION 2004*/

```
int FindChunk (int num, int lsb_bit, int n_bits)
{
        int val, mask;

mask = (1<<n_bits)-1;

val = (num >> lsb_bit) & mask;

return (val);

}

/* Start with one rule.
Find Split Point. If no split point, then done. If split point, then
left is >= and right is <=. For left, each further level that is not
fully-zero contributes one rule. For right, each further level that
is not fully-one contributes one rule.*/ int    FindGenericExpand (int strt, int end, int *sp_arr, int n_sp,
int *sch_gen)
{ int chunk_left, chunk_right, n_rules, rules_from_left,
rules_from_right;

int i,j, redund_rule, k, is_rule_at_split=0;
        int lsb_bitpos[10];

n_rules = 1;
        lsb_bitpos[n_sp-1] = 0;
        for (i=n_sp-2; (i>=0); i--)
        {
                lsb_bitpos[i] = lsb_bitpos[i+1]+sp_arr[i+1];
        } for (i=0; (i<n_sp); i++)
        {
                chunk_left  = FindChunk (strt, lsb_bitpos[i], sp_arr[i]);
                chunk_right = FindChunk (end , lsb_bitpos[i], sp_arr[i]);

if (chunk_left == chunk_right)
                {
                        continue;
                }
                else
                {
                        /*split point found*/
                        /*This level will have a rule if it has to
                        represent something other than the left and
                        right arms of the range*/
                        is_rule_at_split = ((chunk_right-chunk_left) > 1);
                        break;

```
        if (i==n_sp)
        {
                *sch_gen = 1;
                return (1); /*No split point found */
        }

/*Find the level closest to the LSB that is non-zero >= value*/
        for (j=n_sp-1; (j>i); j--)
        {
                chunk_left  = FindChunk (strt, lsb_bitpos[j], sp_arr[j]);

if (chunk_left != 0) break;
        }

/*Now 'j' contains the level that has 'non-zero' >= value*/
        /*Between i-j, level with > value to be 11111 does not produce
        any rule*/
        redund_rule=0;
        for (k=i+1; (k<j); k++)
        {
                chunk_left = FindChunk (strt, lsb_bitpos[k], sp_arr[k]);
                if (chunk_left == ((1<<sp_arr[k])-1)) redund_rule++;
        }
        rules_from_left = (j-i) - redund_rule;
        /*If the left branch is consumable by just 1 rule at the
        split point (i.e, left branch is equivalent to >=0 in the
        left branch, thus translating to a prefix with no bits
        specified in the remaining bits, which is translated to
        an 'x' in the corresponding bit position in the level above*/
        if (rules_from_left == 0) is_rule_at_split = 1;

/*Find the level closest to the LSB that is non-1111..11 <=
value*/ for (j=n_sp-1; (j>i); j--)
        {
                chunk_right  = FindChunk (end, lsb_bitpos[j], sp_arr[j]);
                if (chunk_right != ( (1<<sp_arr[j]) -1)) break;

}
        redund_rule=0;
        for (k=i+1; (k<j); k++)
        {
                chunk_right = FindChunk (end, lsb_bitpos[k], sp_arr[k]);
                if (chunk_right == 0) redund_rule++;
        }

/*Now 'j' contains the level that has 'non-zero' >= value*/
        rules_from_right = (j-i)-redund_rule;

if (rules_from_right == 0) is_rule_at_split = 1;
        n_rules = is_rule_at_split + rules_from_left +
rules_from_right;
        *sch_gen = n_rules;
        return (n_rules);

}
```

FIG. 5B (continued from FIG. 5A)

| METHOD | EXPANSION FACTOR | % IMPROVEMENT |
|---|---|---|
| CONVENTIONAL PRE-FIX ENUMERATION | 14 | 0% |
| DIRPE x2 NON-OVRLP | 10.67 | 31% |
| DIRPE x2 OVRLP | 9.55 | 47% |

| METHOD | EXPANSION FACTOR | % IMPROVEMENT |
|---|---|---|
| CONVENTIONAL PRE-FIX ENUMERATION | 5.25 | 0% |
| DIRPE x2 NON-OVRLP | 4.1 | 28% |
| DIRPE x2 OVRLP | 3.8 | 38% |

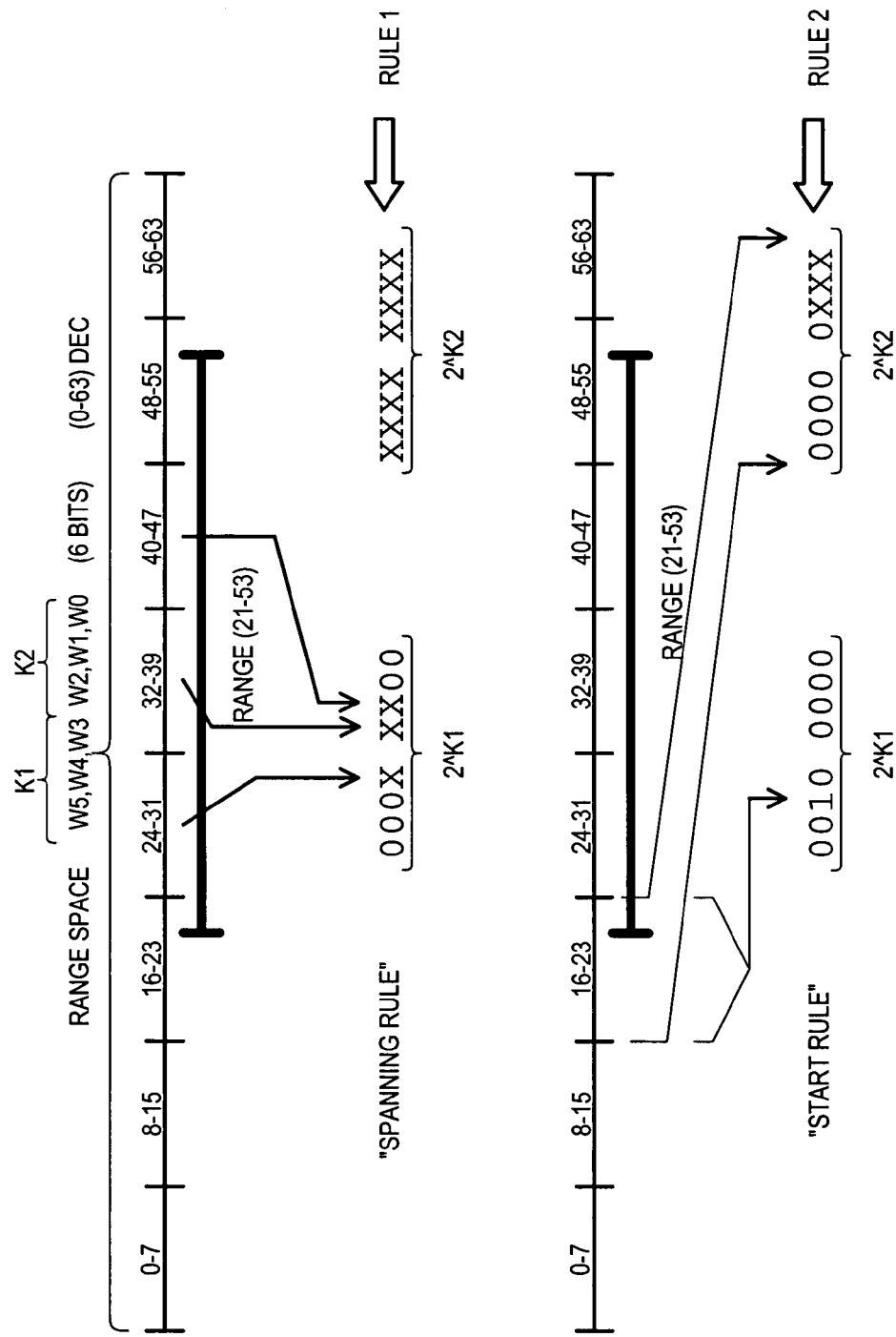

W = 5, K1=3, K2=2

| | RULES (ENTRIES) | | |
|---|---|---|---|
| | 2^K1=8  2^K2=4 | | RANGE |

| | | | |
|---|---|---|---|
| LOWER BOUND (w/ SPAN) | {000X XXXX XXXX} SPAN RULE (LVL1)<br>{0010 0000 00XX} START RULE (LVL2) | | 10-31 |
| UPPER AND LOWER BOUND (w/ SPAN) | {000X XX00 XXXX} SPAN RULE (LVL1)<br>{0010 0000 00XX} START RULE (LVL2)<br>{0000 0010 XXX0} END RULE (LVL2) | | 10-26 |
| UPPER BOUND (w/ SPAN) | {XXXX XX00 XXXX} SPAN RULE (LVL1)<br>{0000 0010 XXX0} START RULE (LVL2) | | 0-26 |
| UPPER AND LOWER BOUND (NO SPAN) | {0010 0000 00XX} START RULE (LVL2)<br>{0001 0000 XX00} END RULE (LVL2) | | 10-13 |
| UPPER AND LOWER BOUND (NO SPAN) | {0010 0000 0XX0} START/END RULE (LVL2) | | 9-10 |
| SPAN ONLY | {000X XX00 XXXX} START/END RULE (LVL1) | | 12-23 |

FIG. 12

RANGE SPACE BITS = W = 16
W = K1(4BITS) + K2(4BITS) + K3(4BITS) + K4(4BITS)

| | | | | |
|---|---|---|---|---|
| RULE 1 | 0000 00XX XXX0 0000 | XXXX XXXX XXXX XXXX | XXXX XXXX XXXX XXXX | XXXX XXXX XXXX XXXX |
| RULE 2 | 0000 0100 0000 0000 | 0000 00XX XXXX XXXX | 0000 0000 XXXX XXXX | XXXX XXXX XXXX XXXX |
| RULE 3 | 0000 0100 0000 0000 | 0000 0100 0000 0000 | 0000 0001 0000 0000 | 0000 0000 XXXX XXXX |
| RULE 4 | 0000 0100 0000 0000 | 0000 0100 0000 0000 | 0000 0000 0000 0000 | XXXX XXXX XXXX XXXX |
| RULE 5 | 0000 0000 0001 0000 | XXX0 0000 0000 0000 | XXXX XXXX XXXX XXXX | XXXX XXXX XXXX XXXX |
| RULE 6 | 0000 0000 0001 0000 | 0001 0000 0000 0000 | XXXX XX00 0000 0000 | XXXX XXXX XXXX XXXX |
| RULE 7 | 0000 0000 0001 0000 | 0001 0000 0000 0000 | 0000 0010 0000 0000 | XX00 0000 0000 0000 |

| | |
|---|---|
| RULE i | 0000 XXX0 0000 0000    XXXX XXXX XXXX XXXX |
| DATA i | 0000 XXX0 0000 0000    XXXX XXXX XXXX XXXX |
| MASK i | 0000 1111 0000 0000    1111 1111 1111 1111 |
| RULE j | 0001 0000 0000 0000    0000 0000 00XX XXXX |
| MASK j | 0000 0000 0000 0000    0000 0000 0011 1111 |
| RULE k | 0000 0001 0000 0000    XXXX XXXX 0000 0000 |
| MASK k | 0000 0001 0000 0000    1111 1111 0000 0000 |

FIG. 13B

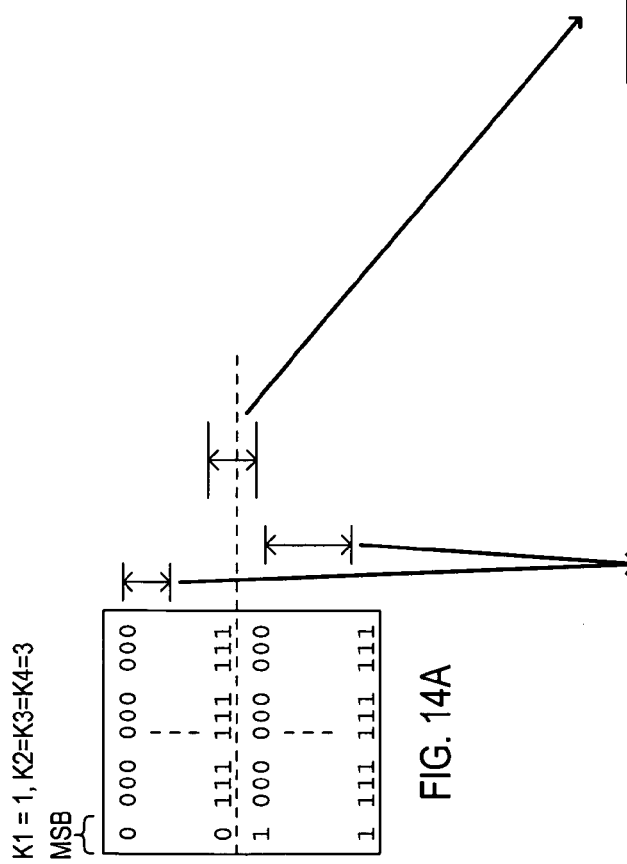

| BITS LOOKED AT IN LEVELS | EXTRA BITS PER ENTRY | WORST CASE EXPANSION |
|---|---|---|
| 1 BIT at a time | 0 | 30 |
| 2 BITS at a time (DIRPE x2 Non-Ovlp) | 16 | 15 |
| 4/3/3/3/3 (DIRPE xK) | 32 | 9 |
| 4/4/4/4 (DIRPE xK) | 48 | 7 |
| 6/5/5 (DIRPE xK) | 112 | 5 |
FIG. 16
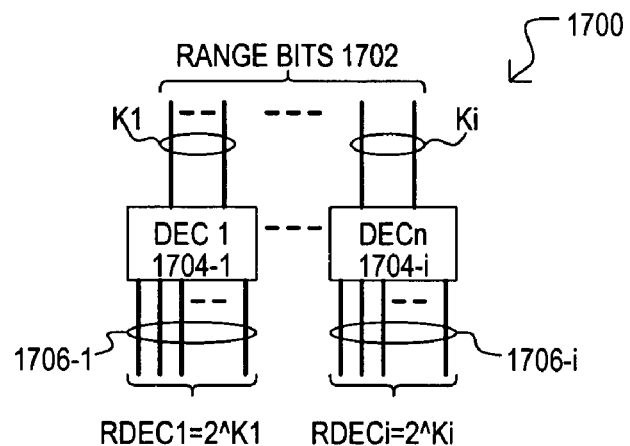
FIG. 17A
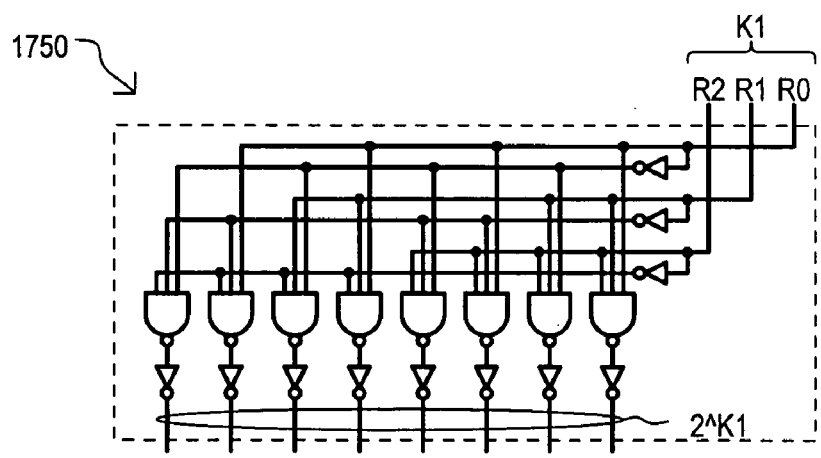
FIG. 17B

| BITS LOOKED AT IN LEVELS | # SEARCHES NEEDED | EXTRA BITS PER ENTRY | WORST CASE EXPANSION |
|---|---|---|---|
| 1 BIT at a time | 1 | 0 | 30 |
| 4/3/3/3/3 (DIRPE xK) | 5 | 20 | 9 |
| 4/4/4/4 (DIRPE xK) | 4 | 20 | 7 |
| 6/5/5 (DIRPE xK) | 3 | 68 | 5 |
| 1/5/5/5 (DIRPE xK) | 3 | 36 | 6 |

RANGE = (2<R<3)

| VALUES | PREFX | MAP |
|---|---|---|
| 0000<br>0001 | 000X | RANGE1 (R<2) |
| 0010<br>0011 | 001X | RANGE2 (2≤R≤3) |
| 0100<br>0101<br>0110<br>0111 | 01XX | RANGE3 (R>3) |
| 1000<br>1001<br>1010<br>1011<br>1100<br>1101<br>1110<br>1111 | 1XXX | RANGE3 (R>3) |

RANGE = (8<R<9)

| VALUES | PREFX | MAP |
|---|---|---|
| 0000<br>0001<br>0010<br>0011<br>0100<br>0101<br>0110 | 0XXX | RANGE: <7 |
| 0111 | 0111 | |
| 1000<br>1001 | 100X | RANGE: 7-10 |
| 1010 | 1010 | |
| 1011 | 1011 | RANGE: 11 |
| 1100<br>1101<br>1110<br>1111 | 11XX | RANGE: R>12 |

RANGE = (2<R<3)

| VALUES | ENC | MAP |
|---|---|---|
| 0000<br>0001 | 00 | RANGE1 (R<2) |
| 0010<br>0011 | 01 | RANGE2 (2<R<3) |
| 0100<br>0101<br>0110 | 10 | RANGE3 (R>3) |
| 0111<br>1000<br>1001<br>1010<br>1011<br>1100<br>1101<br>1110<br>1111 | | |

RANGE = (8<R<9)

| VALUES | ENC | MAP |
|---|---|---|
| 0000<br>0001<br>0010<br>0011<br>0100<br>0101<br>0110 | 00 | RANGE: <7 |
| 0111<br>1000<br>1001<br>1010 | 01 | RANGE: 7-10 |
| 1011<br>1100<br>1101<br>1110<br>1111 | 10 | RANGE: >10 |

US 7,711,893 B1

RANGE CODE COMPRESSION METHOD AND APPARATUS FOR TERNARY CONTENT ADDRESSABLE MEMORY (CAM) DEVICES

COPYRIGHT AUTHORIZATION

A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all (copyright or mask work) rights whatsoever.

TECHNICAL FIELD

The present invention relates generally to search engine systems that include ternary content addressable memory (CAM) devices, and more particularly to ternary CAM search engine systems that provide range matching capabilities.

BACKGROUND OF THE INVENTION

The relatively rapid speed at which content addressable memories (CAMs) can compare multiple entries to an applied search key value, has resulted in CAMs enjoying widespread use in higher speed applications, such as network packet processing.

Conventional CAMs may include binary CAMs and ternary CAMs. Binary CAMs typically include entries that can each store a data value having a number of data bits. In most cases, a match indication can be generated when all bits of a search key match all the bits of an entry. Thus, in a typical binary CAM, bits of an entry may have a value of 0 or 1. A corresponding search key (i.e., comparand) value is said to match its corresponding entry when it is exactly the same.

CAMs may also include ternary CAMs. Ternary CAMs may typically include entries having data bits that can be masked from a compare operation. Thus, in a typical ternary CAM, bits of an entry can be conceptualized as having a value of 0, 1 or "X". A corresponding search key bit value is said to match its corresponding entry bit when it is either the same, or when the entry bit has the X ("don't care" or masked) value.

Recently, various packet processing operations have given rise to the need for range matching operations. In a range matching operation, a portion (or all) of a search key value can be examined to determine if it falls within a range, as opposed to simply matching an entry value. One particular application that can employ range matching can be access control lists (ACL). An ACL may present a set of rules that can limit access (e.g., forwarding of packets) to only those packets having fields failing within a particular range.

Conventionally, CAMs have been utilized to express rules to provide range rule matching functions. A first conventional range rule matching arrangement is represented in FIGS. 20A, 20B and 21. FIGS. 20A and 20B illustrate how a range can be encoded according to common prefix values.

FIG. 20A shows how three ranges R<2, 2≦R≦3 and R>3 are encoded into four entries over a space of 0-15 (0000-1111 binary). As shown, those values lower than the range 2-3 can be encoded by utilizing an entry value of 000X, which has a common prefix of "000". The range itself, encodes into an entry value of 001x, which has a common prefix of "000". The range 2≦R≦3 encodes into one entry "001X". Finally, those values in the last range R>3 encode into two entries, one having a common prefix of "01" the other having a common prefix of "1".

In this way, a range can be "enumerated" by prefixes values that contain the range, or portions of the range.

One skilled in the art would recognize that such worst case result for a conventional prefix enumeration approach can be generalized as follows. For a range space defined by a W bits, the worst case number of rules (i.e., entries) to define a range ends up being 2W−2.

A drawback to the conventional arrangement is represented by FIG. 20B. The conventional approach of enumerating prefix can provide relatively compact results (a small number of entries) only when a range falls on convenient boundaries. As shown by FIG. 20B, a range of 7-10 in a space 0-15 encodes into 3 entries. Such a result represents a worst case result, as there is a prefix greater than one on each side of the range.

FIG. 21 shows a CAM device that may incorporate the range matching arrangement of FIGS. 20A and 20B. As shown by FIG. 21, a CAM device 2100 can be a conventional ternary CAM device that applies a search key value that includes W bits to ternary CAM entries 2102-1 to 2102-n. Each CAM entry (2102-1 to 2102-n) can include a corresponding W bits for storing a range rule. It is understood that all bits of a search key value can carry range bit values, or only a portion thereof (e.g., the search key has one or more groups of bits for comparison to one or more ranges).

While a conventional approach like that of FIGS. 20A, 20B and 21 may result in an undesirably large number of entries when encoding certain range values, the approach does have a number of advantages. First, little (or no) additional hardware may be needed accommodate range matching. Second, updating the CAM device can be accomplished relatively quickly. If new range information is needed, provided empty entries are available, new values are written into the CAM (assuming no additional priority for such entries is required).

A second conventional range rule matching arrangement is represented in FIGS. 22A and 22B and 23. FIGS. 22A and 22B illustrate how a range portion of a rule can be uniquely encoded utilizing range preclassification. In a conventional range preclassification approach, entire ranges are encoded into unique values.

FIGS. 22A and 22B show how preclassification can encode the same range values as those shown in FIGS. 20A and 20B. As shown by FIGS. 22A and 22B, preclassification can encode any range into one value ENC regardless of where the range falls along bit boundaries.

In this way, a range rule can be mapped to a unique entry value. One skilled in the art would recognize that conventional preclassification can greatly reduce the number of rules (essentially one entry per range rule).

However, conventional preclassification approaches can have drawbacks. First, preclassification can require knowledge of an entire range mapping database, in order to ensure unique values are provided for each range. That is, before any new range is added, an entire existing database is checked to ensure that the encoded value will be unique to the range.

FIG. 23 shows a CAM device that may incorporate the range rule matching arrangement of FIGS. 22A and 22B. As shown by FIG. 23, a CAM device 2300 can be a conventional ternary or binary CAM device that applies a search key value of W bits to CAM entries 2302-1 to 2302-n, each of which includes a corresponding W bits for storing a range rule.

In the event preclassification is performed "on-board" the device, the CAM device 2300 will have to include preclassification hardware 2304. This may undesirably increase the size and complexity of the device. If preclassification is performed outside of the CAM device 2300, a processor or the like, along with accompanying routines would be necessary to preprocess range values prior to application to the CAM device 2300.

Referring now to FIG. 24, one example of a range rule search key is shown to illustrate how a search key can require both standard bit matching (ternary matching) as well as range matching. The search key of FIG. 24 includes five search fields (FIELD1 to FIELD5). Search fields FIELD1, FIELD3 and FIELD4 are ternary match fields. Thus, these fields can be compared on a bit wise basis to arrive at a match result. However, search fields FIELD2 and FIELD5 are range match fields. Thus, such fields are examined to determine if they fall within a given range in order to arrive at a match result.

The above example shows how range rule matching can require numerous entries when expressed within a CAM device.

In light of the above, it would be desirable to arrive at some way of providing range rule matching capabilities that can result in a smaller number of rules than conventional prefix enumeration approaches.

At the same time, it would also be desirable to arrive at some way of providing range rule matching capabilities that provides faster and/or easier updating of rules than conventional preclassification approaches.

SUMMARY OF THE INVENTION

The present invention can include a method for generating ternary content addressable memory entries to represent a search range. In the method range code values can be generated to represent the search range, where the range code values can include a plurality of bit values. The method includes compressing range code values that vary from one another by predetermined least significant bit values into one range code value, and adding an extra bit to the range code value to indicate how compressed range code value has been generated.

In such an arrangement, the number of range codes needed to express a range can be reduced at the cost of an overall increase in entry size.

According to one aspect of the embodiments, the step of compressing range code values can include determining:
if the last two bit values of a first range code prefix are "01", a next higher prefix value matches all bits of higher significance than the last two bits of the first range code prefix, and
the two bits of the next higher prefix value corresponding to the last two bits of the lowest range code prefix value are "1X".

In such a case, a compressed range code value can represent the two range code values, with the compressed range code value being the same as the first range code value, except for the last two bits of the prefix being changed to "XX". Further, the step of adding an extra bit to the compressed range code value can include setting an extra lower bound bit to "1" that corresponds to the two bit values changed from 01 to XX.

In this way, two prefix values representing portions of a range can be compressed into a single rule.

According to one aspect of the embodiments, the step of compressing range code values can include determining:
if the last two bit values of a first range code prefix are "10", a next lower prefix value matches all bits of higher significance than the last two bits of the first range code prefix, and
the two bits of the next lower prefix value corresponding to the last two bits of the lowest range code prefix value are "0X".

In such a case, a compressed range code value can represent the two range code values, with the compressed range code value being the same as the first range code value, except for the last two bits of the prefix being changed to "XX". Further, the step of adding an extra bit to the range code value can include setting an extra high bound bit to "1" that corresponds to the two bit values changed from 10 to XX.

In this way, two prefix values representing portions of a range can be compressed into a single rule.

According to another aspect of the embodiments, the step of adding an extra bit to the range code value includes adding extra E bits to each range code value, where E is an integer, each of the E bits corresponding to two bit locations of adjacent significance and representing a range code generates by compressing to range codes that vary at the two bit locations.

In this way, range codes can be compressed according to predetermined variations in two-bit sections of the range codes.

According to another aspect of the embodiments, the number of bits in the range code values is W, and the number of additional bits E can be equal to at least ½W, with each E bit representing non-overlapping two bit locations beginning with the least significant two bit locations.

In this way, range code compression can be accomplished according to predetermined variations in non-overlapping two-bit sections of the range codes.

According to another aspect of the embodiments, a number of extra bits E can be equal to W. Further, such extra E bits can include L bits representing a lower bound group of W/2 extra bits, each L bit indicating when bit values are compressed to represent a lower bound limitation in the range. Further, the extra E bits can also include an upper bound group of W/2 bits that indicates when bit values are compressed to represent an upper bound limitation in the range.

In this way, range code compression can be accomplished according to predetermined variations in non-overlapping two-bit sections of the range codes to merge upper bound and lower bound range code values.

According to another aspect of the embodiments, a number of bits in the range code values is W, where W is an integer. In addition, a number of extra bits E can be equal to at least W−1, each E bit representing overlapping two bit locations beginning with the least significant two bit locations.

In this way, range code compression can be accomplished according to predetermined variations in overlapping two-bit sections of the range codes.

According to another aspect of the embodiments, the number of extra bits E can be equal to 2(W−1). Further, such extra bits can include a lower bound group of L=W−1 bits that indicates when bit values are compressed to represent a lower bound limitation in the range, and an upper bound group of H=W−1 bits that indicates when bit values are compressed to represent an upper bound limitation in the range.

In this way, range code compression can be accomplished according to predetermined variations in overlapping two-bit sections of the range codes to merge upper bound and lower bound range code values.

The present invention can also include a method for generating search key values for a range search in a ternary content addressable memory (CAM). The method can include logically combining bit pairs of a search key value to generate encoded bits in addition to the search key bits, applying the bits of the search key to corresponding search bits of entries in the ternary CAM, and applying the encoded bits to corresponding additional bits of entries in the ternary CAM, the additional bits of each entry being different than the search bits of the entry.

In this way encoded bit values can be generated in a relatively fast and/or relatively easy fashion from a search key value.

According to another aspect of the embodiments, the step of logically combining adjacent bit pairs includes logically ORing each bit pair with circuits on the ternary CAM.

According to another aspect of the embodiments, the step of logically combining adjacent bit pairs includes logically NANDing each bit pair with circuits on the ternary CAM.

In this way encoded bit values can be generated "on-chip" for rapid results. Further, the type of encoding involves relatively little additional circuitry.

According to another aspect of the embodiments, the step of logically combining bit pairs includes logically combining adjacent bit pairs in a non-overlapping manner beginning with the least significant bit pair.

In this way encoded bit values can be generated that are compatible with DIRPE ×2 Non-overlapping encoding, as will be described in more detail below.

According to another aspect of the embodiments, the number of bits in the search key is W, where W is an integer. Further, the step of logically combining bit pairs includes logically combining non-overlapping adjacent bit pairs beginning with the least significant bit pair. This can generate ½W encoded bits that are applied to additional bits of the entries that represent lower boundary compression, and ½W encoded bits that are applied to additional bits of the entries that represent higher boundary compression.

In this way encoded bit values can be generated that are compatible with DIRPE ×2 Non-overlapping encoding for both high and low range bounds, as will be described in more detail below.

According to another aspect of the embodiments, the step of logically combining bit pairs can include logically combining adjacent bit pairs in an overlapping manner beginning with the least significant bit pair.

In this way encoded bit values can be generated that are compatible with DIRPE ×2 Overlapping encoding, as will be described in more detail below.

According to another aspect of the embodiments, the number of bits in the search key can be W. Further, the step of logically combining bit pairs includes logically combining overlapping adjacent bit pairs beginning with the least significant bit pair to generate W−1 encoded bits that are applied to additional bits of the entries that represent lower boundary compression, and W−1 encoded bits that are applied to additional bits of the entries that represent higher boundary compression.

In this way encoded bit values can be generated that are compatible with DIRPE ×2 Overlapping encoding for both high and low range bounds, as will be described in more detail below.

The present invention may also include a method for generating search key values for a range search in a ternary content addressable memory (CAM). The method includes
dividing a search key of W bits into at least two portions having K1 bits and K2 bits,
encoding the portion having K1 bits into $2^{K1}$ values, where only one of the $2^{K1}$ is activated for each possible value of the K1 bits;
encoding the portion having K2 bits into $2^{K2}$ values, where only one of the $2^{K2}$ is activated for each possible value of the K2 bits; and
applying the $2^{K1}$ values and $2^{K2}$ values to corresponding bits of ternary CAM entries encoded with range code values.

In this way encoded bit values can be generated that are compatible with DIRPE ×K encoding, as will be described in more detail below.

According to another aspect of the embodiments, the step of encoding the portion having K1 bits includes applying the K1 portion to a decoder formed on the CAM device.

According to another aspect of the embodiments, the step of encoding the portion having K2 bits includes applying the K2 portion to a decoder formed on the CAM device.

In this way, encoded bit values can be generated in a relatively fast and/or relatively easy fashion from a search key value.

According to another aspect of the embodiments, the method can further include applying the $2^{K2}$ values and $2^{K1}$ bit values to CAM entries essentially simultaneously.

According to another aspect of the embodiments, the method can further include applying the $2^{K2}$ values along with at least one level value to CAM entries in one search operation, and applying the $2^{K1}$ values along with at least another level value to the CAM entries in a different search operation.

In this way, a search operation can be divided into different portions, with separate sections of a search key value being encoded and applied to CAM entries in different search operations.

The present invention can also include a method for generating ternary content addressable memory (CAM) entries to represent a search range. The method can include dividing a range space represented by a W bits into at least a first portion including K1 bits and a second portion of K2 bits, where the K1 bits are more significant than the K2 bits. The method also includes representing the range space with $2^{K1}$ bits, each of the $2^{K1}$ bits representing a different equal sized division of the range space, and representing at least one of the divisions with $2^{K2}$ bits, each of the each of the $2^{K2}$ bits representing an equal sized subdivision of the at least one division.

In this way, a range space can be represented by CAM entries having multiple sections, each section representing a finer division of the range space. Such an arrangement can enable a range to be expressed by a smaller number of entries than conventional prefix enumeration approaches.

According to another aspect of the embodiments, each of the $2^{K1}$ bits of a division that is fully excluded from the search range is represented by a binary "0" value.

According to another aspect of the embodiments, each of the $2^{K1}$ bits of a that is fully included in the search range is represented by a don't care value (X), a don't care value matching either a binary "1" or binary "0" in a search operation.

In this way, divisions of a range space included within range limits can be represented by a sequence of "don't care" values.

According to another aspect of the embodiments, each of the $2^{K1}$ bits of a division that is partially included in the search range is represented by binary 1 value.

In this way, divisions of a range space that include the start of a range or the end of a range, but are not fully within a range limits, can be represented by a bit value of 1.

According to another aspect of the embodiments, the method can also include storing the $2^{K2}$ bits and $2^{K}$ bits in the same CAM entry.

According to another aspect of the embodiments, the method can also include storing the $2^{K2}$ bits in one CAM entry along with a second level value, and storing the 2^K1 bits in a different CAM entry along with a first level value.

In this way, such range values can be stored in a larger number of CAM entries, but with smaller entry widths.

The present invention can also include a ternary content addressable memory (CAM) device having a compare data input that receives search key values that include W bits and at least a first encoder for logically combining bit pairs of the search key value to generate E additional bits. The CAM device can also include at least one ternary CAM array having entries of M-bit width coupled to receive the W bits of the search key in parallel with the E additional bits, with M being greater than or equal to W+E.

In this way, a CAM device can include an encoder for rapidly encoding search key values (or range fields within search key values) for application to compressed range rule sets.

According to another aspect of the embodiments, at least the first encoder comprises a plurality of first logic gates that logically OR bit pairs of the search key value.

According to another aspect of the embodiments, at least the first encoder comprises a plurality of second gates that logically NAND bit pairs of the search key value.

According to another aspect of the embodiments, at least the first encoder logically combines bit pairs of adjacent significance in a non-overlapping manner to generate at least two additional bit values for each bit pair of the search key, such that E=W.

According to another aspect of the embodiments, at least the first encoder logically combines bit pairs of adjacent significance in an overlapping manner to generate two additional bit values for each bit pair of the search key, such that E=2(W−1).

The present invention can also include a ternary content addressable memory (CAM) device having a compare data input that receives search key values that include W bits, where W is an integer and at least a first encoder that encodes at least two different portions of the search key, including encoding K1 bits of a first portion into 2^K1 encoded bits and K2 bits of a second portion into 2^K2 encoded bits. The CAM device can also include at least one ternary CAM array having entries coupled to receive the 2^K1 encoded bits and 2^K2 encoded bits.

According to another aspect of the embodiments, the at least one ternary CAM array receives the 2^K1 encoded bits and 2^K2 encoded bits in parallel.

According to another aspect of the embodiments, the CAM device includes a level encoder that generates a level value bits and the at least one ternary CAM array receives the 2^K1 encoded bits and level value bits in parallel in one search operation, and receives the 2^K2 encoded bits and level value bits in parallel in another search operation.

BRIEF DESCRIPTION OF THE DRAWINGS

FIGS. 1A and 1B are tables comparing prefix enumeration encoding of range values to range encoding according to a first embodiment.

FIGS. 2A and 2B are additional tables comparing prefix enumeration encoding of range values to range encoding according to a first embodiment.

FIG. 3 is a table comparing range codes (CAM entries) according to a conventional prefix enumeration approach, and embodiments of the present invention.

FIGS. 4A and 4B show an example of a function for categorizing prefix for compression according to various embodiments of the present invention.

FIGS. 5A and 5B show an example of a function for simulating the number of rules (CAM entries) needed for a given range according to a conventional methods and that according to embodiments of the present invention.

FIGS. 11A to 11C are various examples of range rules (CAM entries) according to another embodiment of the present invention.

FIG. 12 is a table showing the types of range rule sets that can be generated according to embodiments of the present invention.

FIG. 13A is a table showing one example of a range rule set for a larger search key value. FIG. 13B is a table showing how data and mask values provide range rules FIGS. 14A to 14C are tables showing range codes according to another embodiment.

FIG. 16 is a table comparing range rule results for a conventional approach versus those of various embodiments of the present invention.

FIGS. 17A and 17B are schematic diagrams of encoding circuits that can be utilized in the embodiment of FIG. 8.

FIGS. 18A to 18C are tables illustrating single search and multiple searches according to embodiments of the present invention.

DETAILED DESCRIPTION

Figures 6, 7, 8:
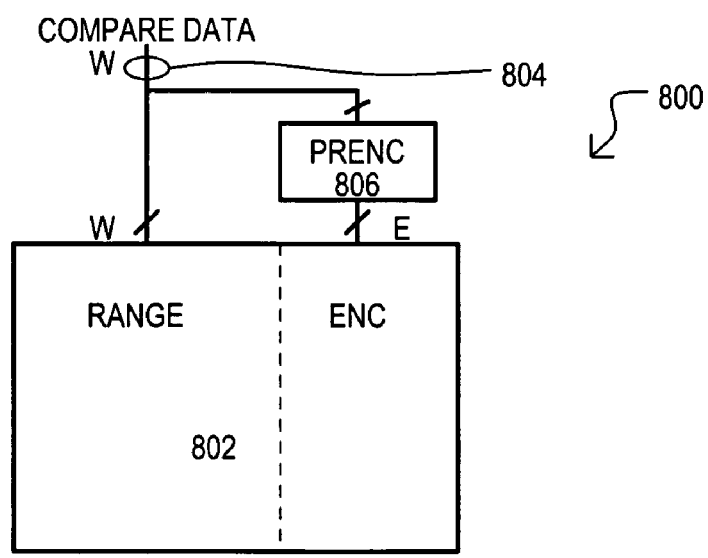
FIG. 6 is a table comparing results for range encoding according a conventional approach and those according to embodiments of the present invention.
FIG. 7 is another table comparing results for range encoding according a conventional approach and those according to embodiments of the present invention.
FIG. 8 is a block schematic diagram of a content addressable memory (CAM) device according to one embodiment.

Various embodiments of the present invention will now be described in detail with reference to a number of drawings. The embodiments include both methods and devices for implementing range matching with a ternary content addressable memory (CAM). Such an arrangements can allow for a more compact rule set (e.g., smaller number of CAM entries for defining range) and allow for rapid updating of CAM entries. Further, in the disclosed embodiments, the amount of additional circuitry needed can be minimal with respect to conventional range preclassification hardware.

According to one embodiment, ranges can be encoded into ternary CAM entries (or portions of ternary CAM entries) utilizing additional bit values that can represent aggregation of bit combinations. Such methods and resulting values will be referred to herein as database independent pre-encoder (DIRPE) methods and values.

Entries According to DIRPE (×2) Embodiments

Referring now to FIGS. 1A to 3, a first embodiment of the present invention will now be described. FIGS. 1A and 1B provide a comparison between low bound range encoding according to a conventional prefix enumeration approach and that of the first embodiment. As shown in FIG. 1A, while only one rule is needed for three of the four ranges, for range >=1, two rules are needed: X1 for covering 01 (and 11) as well as 1X for covering 10 and 11.

According to a first embodiment, with respect to a low bound range limit, a rule (e.g., entry) may include bits a0 and a1, and an additional bit that represents the "aggregation" of prefix values. Thus, the encoding of FIG. 1B includes an additional low bound aggregation bit "L". The low bound aggregation bit can capture the case >=1. Looked at in another way, the aggregation bit covers a range portion in which a lower limit includes the values 01-1X.

It is noted that a low bound aggregation bit L, can be computed as follows L=a0|a1 (where "|" represents a logic OR operation).

Just as a low range bound can include an aggregation bit, so may a high bound rule. Such an arrangement is shown in FIGS. 2A and 2B. Like FIG. 1A, in FIG. 2A two rules are needed for the case <=2: 0X for covering 01 (and 00) as well as X0 for covering 00 and 10.

According to a first embodiment, a rule (e.g., an entry) may include bits a0 and a1 and an additional bit that represents a high bound aggregation of prefix values. Thus, the encoding of FIG. 2B includes an additional high bound aggregation bit "H". The high bound aggregation bit can capture the case <=2. Looked at in another way, the aggregation bit covers a range portion that includes the values 0X-10.

It is noted that a high bound aggregation bit H, can be computed as follows H=NOT(a0*a1) (i.e., a logical NAND-ing of a0 and a1).

In this way, the ranges rules (entries) expressed by prefix enumeration can be examined two bits at a time (×2). If two low bound rules include a 01-1X transition for the two bits (but the rules are otherwise identical), the bits can be set to XX and the corresponding low bound bit can be set to 1. Similarly, if two high bound rules include a 0X-10 transition for the two bits (but the rules are otherwise identical), the bits can be set to XX and the corresponding high bound bit can be set to 1.

It is understood that two bits can be examined in a non-overlapping manner as well as in an overlapping manner. That is, in a non-overlapping case (DIRPE ×2 Non-Overlap) bits pair would be examined in the following order a0/a1, a2/a3, a4/a5, etc. It follows that if a range space is defined by W bits (assuming W is an even integer greater than 0), a DIRPE ×2 Non-Overlap arrangement would add E=W additional bits for each entry (total for entry=2W): L=½W bits define low bound aggregation cases and H=½W bits define a high bound aggregation cases.

In an overlapping case (DIRPE ×2 Overlap) bits pair would be examined in the following order a0/a1, a1/a2, a2/a3, etc. It follows that in a range space is defined by W bits, a DIRPE ×2 Overlap arrangement would add E=2(W−1) bits for each entry (total for entry=3W−2): L=W−1 bits define low bound aggregation cases and H=W−1 bits define a high bound aggregation cases.

A comparison between conventional prefix enumeration and DIRPE approaches according to embodiments of the present invention will be described with reference to FIG. 3.

FIG. 3 shows resulting encoding rules (e.g., entry values) for five range examples. Rule set 300 represents a conventional prefix enumeration approach. Rule set 302 represents a DIRPE ×2 Non-Overlap case. Rule set 304 represents a DIRPE ×2 Overlap case. The five range examples exist on space 0000 to 1111 (bin). The four bits will be referred to herein as a3/a2/a1/a0, with a0 being the least significant bit. Thus, the conventional case 300 includes entries that each includes four bits a3-a0.

The DIRPE ×2 Non-Overlap case 302 also includes four bits a3-a0, but in addition, because the range space is four bits, two extra low bound bits L1/L0 and two extra high bound bits H1/H0 are included. It is understood that low bound bit L1 represents any aggregation of bits a3/a2 and low bound bit L0 represents any aggregation of bits a1/a0. Similarly, high bound bit H1 represents any aggregation of bits a3/a2 and low bound bit H0 represents any aggregation of bits a1/a0.

The DIRPE ×2 Overlap case 304 includes four bits a3-a0, and in addition, because the range space is four bits, three extra low bound bits L2-L0 and three extra high bound bits H2-H0 are included. Low bound bits L2-L0 represent any aggregation of bits a3/a2, a2/a1, a1/a0, respectively. Similarly, high bound bits H2-H0 represent any aggregation of bits a3/a2, a2/a1, a1/a0, respectively.

A comparison between the cases 300 to 304 shows how aggregation of bit values according to a DIRPE approach can reduce the number of rules needed to define a range. More particularly, for a range 1-6, a conventional prefix enumeration (case 300) requires four rules (four CAM entries). In contrast, according to a DIRPE approach, only two CAM entries are needed.

Still further, while DIRPE entries according to the present invention may preferably include both low bound bits and high bound bits (H and L), alternate arrangements could include only low bound bits or only high bound bits.

Generation of DIRPE ×2 Entries

From the above it can be seen that the DIRPE encoding can be viewed as "compressing" particular conventional rules into one rule.

More particularly, in a "low bound" case, a first rule defining a low range limit can have a prefix ending with the binary value "01". That is, the "01" may be the last two bits of the rule, or may be followed by "X" values for all bit locations of less significance. Another rule may include "1X" in the place where the first rule includes "01", but otherwise be the same as the first rule. In such a case, these two rules may be compressed into a single rule that is the same as the first rule, but with the bits "01" being changed to "XX" and a corresponding low bound bit for the pair being changed from X to 1.

In a "high bound" case, a first rule defining a high range limit can have a prefix ending with the binary value "10". That is, the "10" may be the last two bits of the rule, or may be followed by "X" values for all bit locations of less significance. Another rule may include "0X" in the place where the first rule includes "10", but otherwise be the same as the first rule. In such a case, these two rules may be compressed into a single rule that is the same as the first rule, but with the bits "10" being changed to "XX" and a corresponding high bound bit for the pair being changed from X to 1.

One very particular example of a method for categorizing a set of enumerated prefix values for subsequent compression utilizing the above DIRPE ×2 approach is set forth in FIGS.

4A and 4B. FIGS. 4A and 4B illustrate a function for identifying prefix values for compression. The function is represented by C-code and utilizes an array "stk" that includes a number of range entry values, given by a prefix value "stk{n}.prfx" and corresponding prefix length "stk{n}.mlen". Thus, only the first mien bits of the value represents valid match bits, any remaining portions representing bits given a don't care value "X".

Such prefixes are identified as belonging to various schemes, including a Scheme 1 (s1), which corresponds to a conventional prefix enumeration, a Scheme 2 (s2) which corresponds to a DIRPE ×2 Non-Overlap approach, in which a smaller prefix of compressed pair has an odd number of bits, a Scheme 3 (s3) which corresponds to a DIRPE ×2 Non-Overlap approach, in which a smaller prefix of compressed pair has an even number of bits, and a Scheme 4 (s4) which corresponds to a DIRPE ×2 Overlap approach.

In addition, the function utilizes a variable NUMB, which corresponds to overall bit size of the entries.

The operation of the function would be well understood and easily implemented by those skilled in the art as machine readable instructions stored on a machine readable media for execution by a general or specialized processor.

Reference to FIGS. 4A and 4B shows a section 400 that sorts prefix values according to prefix size. A section 402 represents the identification of prefix pairs having the desired low bound transition 01-1X or high bound transition 0X-10, and hence a candidate for compression into a single rule. A section 404 shows a sorting prefix values into the various schemes identified above.

In this way, a method described above can receive enumerated prefix values, normally entered as range defining entries into a ternary CAM device, and provide a new set of values with indicators to identify those entries that may compressed. Such values can then be compressed into a smaller set of range entries for a ternary CAM device.

Simulation Results for DIRPE ×2

The range code compression approach according to the DIRPE ×2 embodiments described above can result in substantial compression in the number of rules needed to describe a range. Further, the above embodiments do not necessarily require pre-existing knowledge of a database containing range mapping. Thus, the present invention can advantageously accommodate range values that can vary randomly, or are otherwise less predictable then "known" data base approaches.

Simulations were executed utilizing randomly generated range values over a 16-bit range space. The simulations were run with a method represented by FIGS. 5A and 5B. FIGS. 5A and 5B show two functions represented with C-code. The function "FindChunk" 500 is called by the subsequently listed function "FindGenericExpand".

The function "FindGenericExpand" receives a range start value "strt" and range end value "end". These values are 16-bit values in the particular example shown. Bits of the "strt" and "end" values are examined in bit sections (sp_arr) to arrive at the number of resulting rules generated for a given range.

For a DIRPE ×2 Non-Overlap case (assuming 16-bit values), range values are examined in two bit sections. That is, the variable "n_sp"=8, and sp_arr{0}=sp_arr{1}=sp_arr{2}=sp_arr{3}=sp_arr{4}=sp_arr{5}=sp_arr{6}=sp_arr{7}=2.

For a DIRPE ×2 Overlap case (assuming 16-bit values), range values are examined in bit sections of 4/3/3/3/3. That is, the variable "n_sp"=5, and sp_arr{0}=4, sp_arr{1}=sp_arr{2}=sp_arr{3}=sp_arr{4}=3.

Results of such simulations are set forth in a table in FIG. 6. As shown in FIG. 6, in a conventional prefix enumeration case, randomly generated range values can result in an expansion factor of 14. That is, representing random ranges can require, on average, 14 entries. In contrast, according to DIRPE ×2 Non-Overlap case, such random ranges require 10.67 entries. Thus, at the cost of 16 extra bits (e.g., CAM entry width), a DIRPE ×2 Non-Overlapping case can reduce the number of entries by 31%. As also shown in FIG. 6, according to DIRPE ×2 Overlapping case, such random ranges can require 9.55 entries. Thus, as the cost of 30 extra bits, a DIRPE ×2 Overlapping case can reduce the number of entries by 47%.

In this way, a DIRPE ×2 range compression approach can substantially reduce the number of rules needed to express a range, and hence the number of CAM entries needed to express a range.

Simulations were also executed that represent more particular application conditions. In some applications, while a range start value can be essentially random, a size of the range is expected to be constrained (e.g., maximum of 100). Such a simulation can model applications in which an access control list (ACL) can be used to select applications that use port numbers restricted to a narrow range (a few tens). Simulation results for such an application are shown in FIG. 7. As shown by FIG. 7, even under such range size restrictions, the DIRPE ×2 range compression approaches can yield significant reductions in the number of CAM entries needed as compared to conventional prefix enumeration approaches.

In this way, the above embodiments can provide significant advantages over conventional prefix enumeration approaches.

Still further, all of the above advantages do not require any preexisting knowledge of expected range values, as best shown by the simulation results, which utilized random range values.

CAM Pre-Encoder According to DIRPE (×2) Embodiments

Referring now to FIG. 8, a CAM device according to one embodiment is set forth in block schematic diagram and designated by the general reference character 800. A CAM device 800 can include a ternary CAM cell array 802 that receives compare data (i.e., search keys or comparands) by way of compare data lines 804. All or a portion of the compare data lines 804 can carry W range bits. Such range bits can be received by a pre-encoder circuit 806. A pre-encoder circuit 806 can generate high and low bound bits according to the range bits.

Referring still to FIG. 8, as noted above, in a DIRPE ×2 case, appropriate search key bits corresponding to low bound bits (L) can be generated by the logical ORing of search key bit pairs. Similarly, search key bits corresponding to high bound bits (H) can be generated by the logical NANDing of search key bit pairs. In addition, in a DIRPE ×2 case, W bits can be encoded into a larger number of bits 2W, and the number of low bound bits (L) would be W/2 and the number of high bound bits (H) would be W/2. In a DIRPE ×2 Non-overlap case, W bits can be encoded into 3W−2 bits, and the number of low bound bits (L) would be W−1 and the number of high bound bits (H) would be W−1.

Figure 9A:
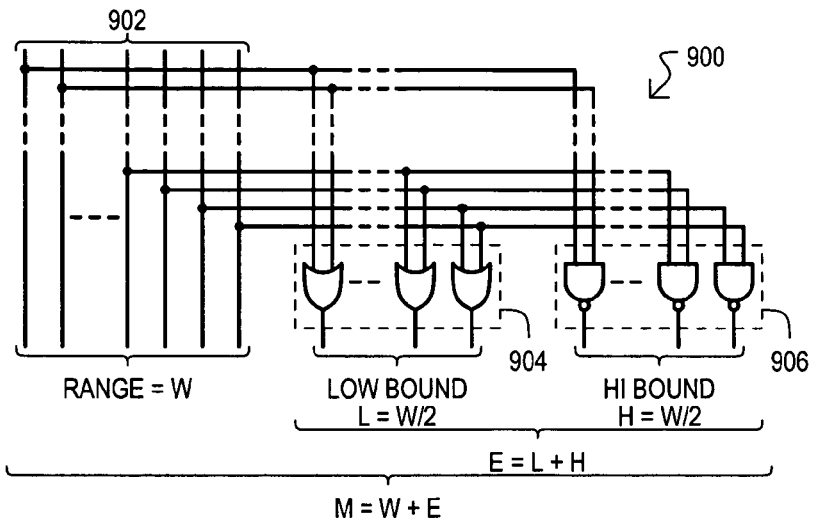
FIGS. 9A to 9B are schematic diagrams of encoding circuits that can be utilized in the embodiment of FIG. 8.

Referring now to FIG. 9A, one particular example of a range pre-encoder according to one embodiment is set forth in a block schematic diagram and designated by the general reference character 900. A range pre-encoder 900 can be used for a pre-encoder like that shown as 806 in FIG. 8 to provide DIRPE ×2 Non-overlap encoding.

A range pre-encoder 900 can include data lines 902, a first set of logic gates 904 and a second set of logic gates 906. Data lines 902 can allow the W range bits to essentially "flow-through" the circuit 900. A first set of logic gates 904 can include W/2 OR gates that encode bit pairs, in a non-overlapping manner, to generate W/2 encoded bits corresponding to low bound (L) bits. A second set of logic gates 906 can include W/2 NAND gates that encode bit pairs, in a non-overlapping manner, to generate W/2 bits corresponding to high bound (H) bits.

It is noted that a pre-encoder 900 can result in a relatively small area increase for a ternary CAM device, needing only 8×W additional gates in a CMOS implementation. This is but a tiny fraction of the gate count needed for most conventional pre-classifiers such at that shown in FIG. 23.

Figure 9B:
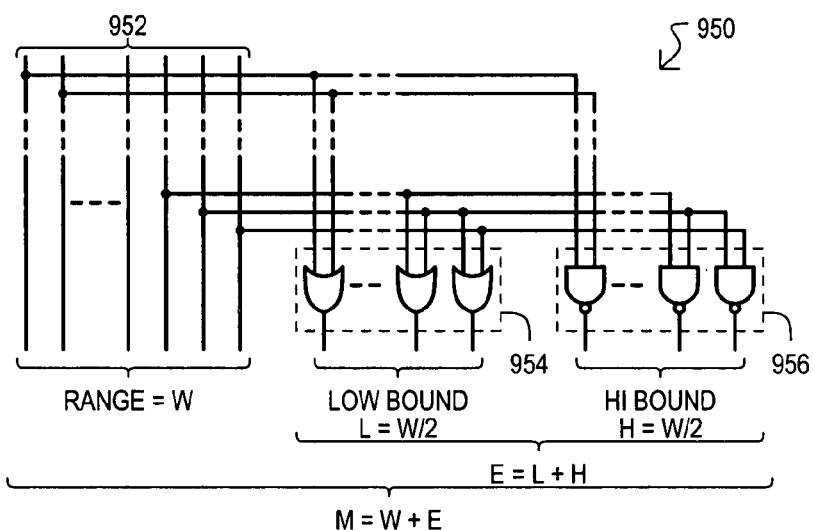

Referring now to FIG. 9B, a second particular example of a range pre-encoder according to an embodiment is set forth in a block schematic diagram and designated by the general reference character 950. A range pre-encoder 950 can be used for a pre-encoder like that shown as 806 in FIG. 8 to provide DIRPE ×2 Overlap encoding.

A range pre-encoder 950 can include the same general components as that of FIG. 9A, including data lines 952, a first set of logic gates 954 and a second set of logic gates 956. Like FIG. 9A, data lines 952 can allow the W range bits to essentially "flow-through" the circuit 950. A first set of logic gates 954 can include W−1 OR gates that encode bit pairs, in an overlapping manner, to generate W−1 encoded bits corresponding to low bound (L) bits. A second set of logic gates 956 can include W−1 NAND gates that encode bit pairs, in an overlapping manner, to generate W−1 bits corresponding to high bound (H) bits.

It is noted that a pre-encoder 950 also results in a relatively small area increase for a ternary CAM device, needing only 16(W−1) additional gates in a CMOS implementation. This too, can be but a tiny fraction of the gate count needed for most conventional pre-classifiers such at that shown in FIG. 23.

In this way, with relatively little additional circuitry, a CAM device can pre-encode key values to generate input values appropriate for bit aggregation entries, such as those generated according to the DIRPE ×2 methods above, as but a few examples.

Entries According to DIRPE (×K) Embodiments

The above embodiments have illustrated cases in which two bits for range rules are examined for possible compression into a single rule. However, the present invention also encompasses approaches that examine more than two bits at a time. Such approaches will now be described as a DIRPE ×K method.

In a DIRPE ×K method, a range space may be represented by W bits. These W bits can then be divided into two or more portions in order of significance (e.g., K1, K2 . . . , with the significance of K1 being higher than K2). The K1 bits may then utilized to represent the range space with $2^{K1}$ bits, with each of the $2^K$ bits representing a different, equal sized division of the range space. Remaining portions (e.g., K2) may represent a successive subdivision ($2^{K2}$) of the space represented by the next higher significance bits.

To better understand CAM entries according to a DIRPE ×K approach, various examples will now be described.

Figure 10:
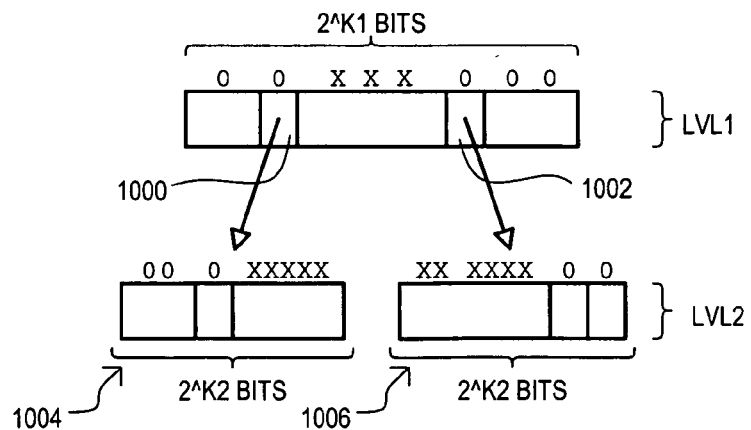
FIG. 10 is a diagram illustrating range rules (CAM entries) according to another embodiment of the present invention.

FIG. 10 is a general representation showing a first example of rules (and hence CAM entries) according to a DIRPE ×K approach. In FIG. 10, a range space can include W bits, where W is an integer. The W bits are split into a more significant portion K1 and a less significant portion K2. A total range space (e.g., 0 to $2^{(W-1)}$) can be conceptualized as being divided into $2^{K1}$ equal sized divisions. If a division falls entirely within a range limit, the bit corresponding to the space is set to a don't care "X" state. Conversely, if a division falls entirely outside a range limit, the bit corresponding to the space is set to a no-match "0" state. In this way, a first level rule (show as LVL1) can illustrate portions of the range space that fall entirely within the limits of a specified range.

As will be described at a later point herein, such a rule can be considered a "spanning" or "span" rule as it represents division of the range space fully spanned by range limits.

The granularity represented by a first level rule cannot always define a desired range limit. Thus, those divisions including the end of a range and the start of the range can be conceptualized as being further subdivided into $2^{K2}$ equal sized subdivisions. As in the first level case, if a subdivision falls entirely within a range limit, the bit corresponding to the space is set to a don't care "X" state. Conversely, if a subdivision falls entirely outside a range limit, the bit corresponding to the space is set to a no-match "0" state.

In the particular example of FIG. 10, a division 1000 includes the start of a range. While division 1000 is represented by a "0" in a first level rule, in a second level rule 1004, the division is further defined by $2^{K2}$ bits. Similarly, a division 1002 includes the end of the range. While division 1002 is represented by a "0" in a first level rule, in a second level rule 1006, the division is further defined by $2^{K2}$ bits.

To better understand the generation of CAM entries according to a DIRPE ×K approach, a number of a particular examples will now be described.

Figure 11C:
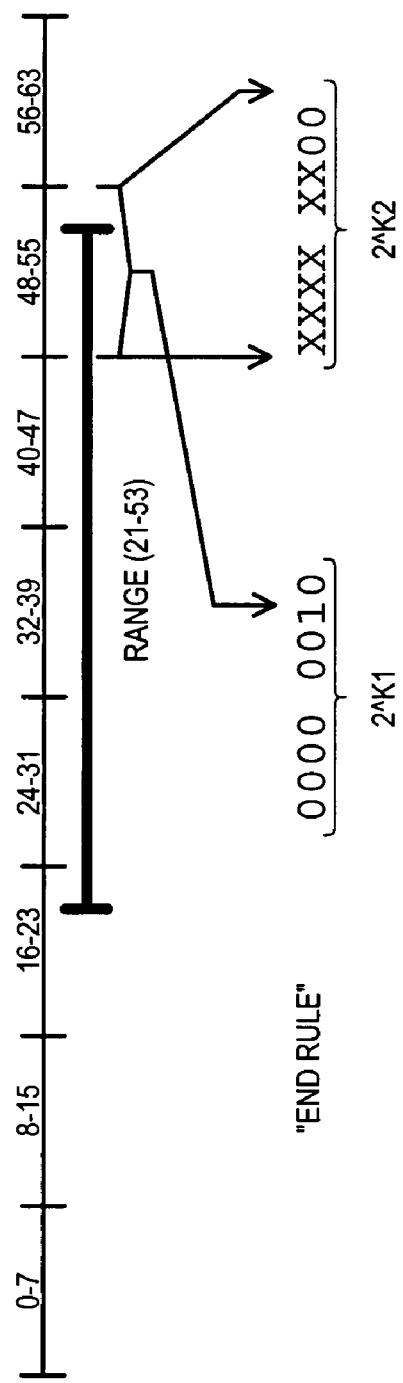

FIGS. 11A to 11C shows one example of CAM entries that can be generated for a range of 21-53 on a 6-bit range space. In the example shown, the 6-bits that define a range space have been divided into a first portion (K1), which includes the three most significant bits, and a second portion (K2), which includes the three less significant bits. Thus, the resulting rules will include a first portion of $2^{K1}$ bits and a second portion of $2^{K2}$ bits. That is, in FIGS. 11A to 11C, W=6, and K1=K2=3.

FIG. 11A shows the generation of a first level or "spanning" rule RULE1 for the given range (21-53). FIG. 11A shows how the range space (0-63) can be conceptualized as being divided into $2^{K1}$=8 equally sized divisions. The resulting RULE1 thus includes $2^{K1}$=8 bits, each corresponding to one of the divisions. For the range limit of 21-53, the first three divisions (0-7, 8-15 and 16-23) are not fully included within the range: 0-7 and 8-15 are entirely outside the range, while 16-23 is only partially included in the range. As a result, the corresponding three left-most bits of the $2^{K1}$ bits are set to "0". The next three divisions (24-31, 32-39 and 40-47) are fully included within the range. As a result, the next three bits (going from left to right) of the $2^{K1}$ bits are set to "X" (don't care). The last two divisions (48-55 and 56-63) are not fully included within the range, thus the two right-most bits of the $2^{K1}$ bits are set to "0".

RULE1 of FIG. 11A also includes $2^{K2}$ bits. However, because it is a spanning rule, all such bits are set to "X" don't care. This can be conceptualized as indicating that all subdivisions of the indicated divisions ($3^{rd}$ to $5^{th}$ bits) are included in the range.

FIG. 11B shows the generation of a second level "start" rule RULE2 for the given range. For the range limit of 21-53, the start of the range (21) is included in the division 16-23. As a result, the corresponding bit (third bit from the left) of the 2^K1 bits is set to "1".

Because RULE2 is a start rule, the remaining 2^K2 bits of the rule further define the start of the range. The 2^K2=8 bits represent the 8 values present in the division indicated by the first part of the rule (division 16-23). Because values 16-20 are outside the range, and values 21-23 are included in the range, the first five left-most bits (corresponding to 16-20) are set to "0". The remaining bits (corresponding to 21-23) are within the range, and so are set to "X".

FIG. 11C shows the generation of a second level "end" rule RULE3 for the given range. For the range limit of 21-53, the end of the range (53) is included in the division 48-55. As a result, the corresponding bit (seventh bit from the left) of the 2^K1 bits is set to "1".

Because RULE3 is an end rule, the remaining 2^K2 bits of the rule further define the end of the range. The 2^K2=8 bits represent the 8 values present in the division indicated by the first part of the rule (division 48-55). Because values 48-53 are included in the range, the first six bits (corresponding to 48-53) are set to "X". The remaining bits (corresponding to 54-55) are outside the range, and so are set to "0".

In this way, range values provided with 6-bit values can be represented by 16 bit CAM entries.

One skilled in the art would understand that a set of rules for a given range determined according to a DIRPE ×K method could take a variety forms depending upon where range limits fall with respect to division/subdivision of a given range space. Examples of such various forms are illustrated in FIG. 12.

FIG. 12 shows various rules for ranges on a 5-bit range space. The rules have been generated according to a 3-bit/2-bit division of the 5-bit range space. The various rules show how, according to the particular range limit, rules may include various combinations of "span" rules, start rules and end rules.

Thus, FIG. 12 provides a general representation of how entries for range matching can appear within a ternary CAM according to a DIRPE ×K approach when a range space (W) is divided into two portions (K1 and K2).

While the above examples have illustrated cases in which the bits of a range space W are divided into 2 portions (K1 and K2), the present invention should not be construed as being limited to such a particular arrangement. It is understood that a range space of W bits can be divided into a larger number of portions. FIG. 13A shows one example of such an arrangement.

FIG. 13A shows a 16-bit range space divided in a 4/4/4/4 manner. That is, the W bits are divided into K1, K2, K3 and K4 portions, each of which includes four bits. As a result, resulting rules include 64 bits=2^K1+2^K2+2^K3+2^K4. It is understood that the first 16 bits of any rule (beginning on the left) correspond to a 4k division of a 64k range space. The next 16 bits represent 256 bit subdivision of a 4k division indicated in the previous 16-bits. Similarly, the third set of 16 bits represents 16 bit divisions of a 256 bit subdivision indicated in the previous 16-bits. The last 16 bits represent the sixteen bit subdivision of the previous 16 bits.

FIG. 13B illustrates data values that may be utilized to write CAM rules as CAM entries. Thus, a rule or entry may be formed by writing two different values to the CAM, including a data value and corresponding mask value. As is well understood, a predetermined mask bit value (in this example 1) will result in the corresponding CAM entry location having a don't care (X) state. Thus, in FIG. 13B, bit locations of data values indicated by an X can be either a 0 or a 1, as they will be masked.

Referring now to FIGS. 14A to 14C, another particular approach to a DIRPE ×K case will be described. This approach, referred herein as DIRPE ×K-MSB, can ignore a most significant bit MSB in rule generation. Thus, range rules can be based on the less significant bits, without having to consider the most significant bit.

In a DIRPE ×K-MSB case, resulting rule sets can be divided into two types according to range spread. In particular, if a range is fully within either half of the range space (i.e., the MSBs of the range start value and range end value are both "0" or both "1"), a resulting range can be expressed by one set of rules according to the less significant bits. If the range "straddles" the MSB transition from 0-1 (i.e., the MSB of the range start is "0" and the MSB of the range end is "1"), the range can be expressed by two rule sets, one having an open ended range start, and the other having an open ended range end.

The very particular example of FIGS. 14A to 14C shows a DIRPE ×K-MSB case illustrating a 1/3/3/3 division of a 10-bit range space. That is, K1=1 and K2=K3=K4=3. FIG. 14A is a representation of the 10 bit range space. On the right of FIG. 14 are three range examples with arrows pointing to how such ranges can be represented in a DIRPE ×K-MSB 1/3/3/3 fashion.

FIG. 14B shows a resulting set of rules corresponding the case where a range falls within an upper or lower half of the range space. In such a case, a rule set appears as if the MSB was ignored, with the 2^K2 bits representing a division of one half the range space (e.g., from 0000000 to 0111111 or from 1000000 to 1111111).

In contrast, FIG. 14C shows a set of rules for the case where the range spans the 0-1 transition of the MSB. In such a case, the resulting rule set can include a first "open ended" rule set 1400, that provides a match indication for values starting with the range start value and ending at the top of the first half of the range space (in this example 0111111). The rule set also includes a second "open ended" rule set 1402, that provides a match indication for values starting at the bottom of the second half of the range space (in this example 1000000) and ending at the range end value.

From the numerous examples above, one skilled in the art could arrive at various other divisions of the bits of a range space to arrive at other ways of generating rules according to DIRPE ×K approaches. Accordingly, the above embodiments should not be construed as limiting to the metes and bounds of the invention.

Generation of DIRPE ×K Entries

Approaches for generating rules (and corresponding CAM entries) according to a DIRPE ×K will now be described.

It will first be assumed that a range start value (strt) and a range end value (end) are expressed by W bit values. The W bits of range values can be divided into chunks $K_i$ (where i=1 to n). The bits of each such chunk are examined in order beginning with K1 in increasingly finer levels. For this discussion a value "v_si" will be considered the value of the $K_i$ bits of a W bit range start value. Similarly, a value "v_ei" will be considered the value of the $K_i$ bits of a W bit range end value.

It is understood that corresponding to first level (K1 bits), a range (>=v_si) can be represented by $2^{K_i}$ bits in the form (0000XXXX), with the Xs starting at position v_si. Similarly, the range (v_si, v_ei) can be represented by $2^{K_i}$ bits in the form (00XXXX00).

To represent a range (strt, end), such a range can be divided up according to the following general steps:

1. If (strt=end) go to step 4, as only a last level will express the range limits. Otherwise, the first level should be found at which the values strt and end differ (i.e., where v_si≠v_ei). Once this level is found, the method can proceed to step 2.

2. At this level, it is determined which (if any) of the 2^Ki space divisions are fully within the range limits: (strictly >strt) and (strictly <end). If any such divisions are fully within the range limits, the bit corresponding to the division is set to "X", otherwise the bit is set to "0".

3. Each lower level will have one entry corresponding to (>start) (i.e., rule further defining a range start) and one entry corresponding to (<end) (i.e., rule further defining a range end). In addition, with such entries, the bit positions in higher levels corresponding to the current level are set with the (=strt) bit 1, or the (=end) bit set to 1, accordingly.

4. A very last level has bits set to Xs in a portion that is (>=strt) or a portion that is (<=end). If a last level is the first level at which "strt" and "end" vary (only chunk Kn varies), or strt=end, there can only be one entry with one or more Xs defining positions (>=strt) and (<=end). If a last level covers a range (>=0), then all bits of this level will be Xs. As a result, the "start" bit position of the previously higher level corresponding to the current level is set to X. Similarly, if a last level covers a range (<=end), then all bits of this level will be Xs, and the "end" bit position of the previously higher level corresponding to the current level is set to X.

Figure 15:
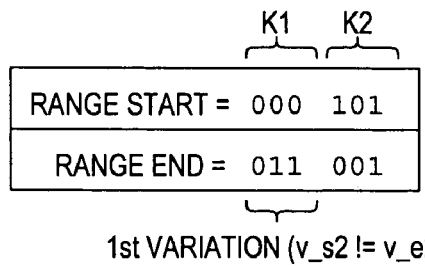
FIG. 15 is a diagram showing a method for generating range rules (CAM entries) according to one embodiment.

An example showing the formation of CAM entries according to the above method will now be described with reference to FIG. 15. FIG. 15 shows the encoding of a six bit range value, which is divided into two chunks K1 and K2 of three bits each. FIG. 15 represents the four steps described above as STEP 1) to STEP 4).

In STEP 1), the first level at which the range bits vary is the first level (chunk K1).

In STEP 2), the 2^K1=8 space divisions are examined to see if they fall completely within the range. Two space divisions meet the criteria (8-15 and 16-23), thus the corresponding bits (bits 2 and 3 from the left) are set to "X". The remaining bits of the 2^K1 bits are set to "0". In addition, all bit of the lower set of 2^K2 bits are set to X.

In STEP 3), lower entries are formed, one for (>strt) and one for (<end). Further, at the higher level of the start entry (>strt) the bit is set to one to indicate the division that includes a start value (=strt). In addition, at the higher level of the end entry (<end) the bit is set to one to indicate the division that includes an end value (=end).

In STEP 4) a last level of the >strt entry has bits set to Xs for values that are >=strt. In a last level of the <end, bits that are <=end are set to Xs.

One skilled in the art could employ the above method to arrive at entries for any division of range values.

Simulation Results for DIRPE ×K

The range code compression approach according the DIRPE ×K embodiments described above can result in substantial compression in the number of rules needed to describe a range. Further, as in the case of DIRPE ×2 approaches, the above DIRPE ×K embodiments do not necessarily require pre-existing knowledge of a database containing range mapping, and thus can accommodate range values that can vary randomly, or are otherwise less predictable then "known" data base approaches.

Simulations were executed utilizing randomly generated range values over a 16-bit range space.

Results of such simulations are set forth in a table in FIG. 16. FIG. 16 provides a comparison of simulation results for range values on a 16 bit range space. FIG. 16 provides results for a conventional prefix enumeration approach (1 BIT at a time), a DIRPE ×2 Non-Overlap approach, like that previously described (2 BITS at a time), and three possible DIRPE ×K cases (4/3/3/3/3, 4/4/4/4 and 6/5/5). It is understood that the DIRPE ×K cases describe how the 16 bits of a range space are portioned and encoded in a "one-hot" manner. The table of FIG. 19A includes shows the number of additional bits needed for each entry (as compared to a conventional case, which utilizes 16 bits).

As shown in FIG. 16, in a conventional prefix enumeration case, randomly generated range values can result in an expansion factor of 30. In contrast, the DIRPE ×K cases result in expansion factors of 9, 7 and 5 for the 4/3/3/3/3, 4/4/4/4 and 6/5/5 cases, respectively.

In this way, a DIRPE ×K range compression approach can substantially reduce the number of rules needed to express a range, and hence the number of CAM entries needed to express a range.

CAM Pre-Encoder According to DIRPE ×K Embodiments

Figures 22A, 22B, 23:
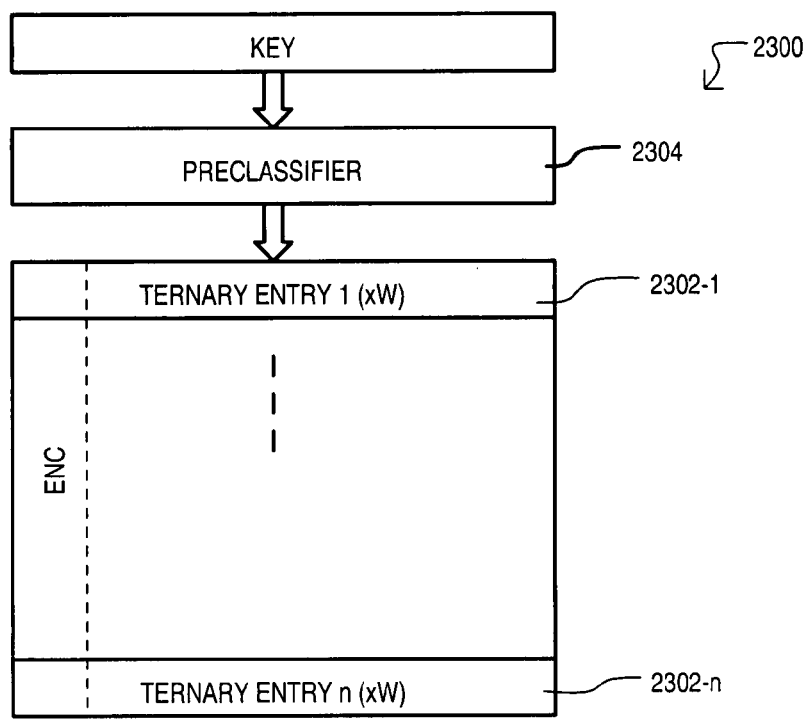
FIGS. 22A and 22B are tables showing conventional prefix encoding according by preclassification.
FIG. 23 is a block schematic diagram of a conventional CAM device having preclassification.

A CAM device according to an embodiment that provides encoding for DIRPE ×K entries can have the same general construction as the CAM set forth in FIG. 23, but with the preclassifier 2304 being replaced by a pre-encoder. Range bits can be received by a pre-encoder circuit, however, such a pre-encoder circuit can provide ×K encoding rather than ×2. Even more particular, in a DIRPE ×K case, appropriate search key bits can be generated by encoding divided portions (e.g., K1, K2 . . . ) of the range bits W in a "one hot" fashion.

Referring now to FIG. 17A, one particular example of a range pre-encoder according to a DIRPE ×K approach is set forth in a block schematic diagram and designated by the general reference character 1700. A range pre-encoder 1700 can be used for a pre-encoder like that noted above.

A range pre-encoder 1700 can receive compare data lines 1702 that carry a range value (or a range field portion of a search key). Such compare data lines 1702 can be divided into portions K1 to Ki, where i is an integer greater than 1. Each compare data line portion (K1 to Ki) can be applied to a decoder circuit that provides a "one-hot" output with respect to received input values. In the very particular example of FIG. 17A, each compare data portion (K1 to Ki) is provided to a corresponding decoder 1704-1 to 1704-i. Decoder 1704-1, which receives K1 input values, can provide 2^K1 output values RDEC1, which are activated in a one-hot manner. That is, a different RDEC1 value is activated for each different value of the K1 bits. The remaining decoder(s) (e.g., 1704-i) can operate in the same fashion, providing one-hot output values.

It is understood that while the above examples have shown an arrangement in which a decoder circuit is provided for each portion of a range value, in other arrangements, a single decoder could be shared among multiple portions via a multiplexer or equivalent arrangement.

Referring now to FIG. 17B, a particular example of a decoder is set forth in schematic diagram and designated by the reference character 1750. A decoder 1750 can be included as a decoder such as that shown as 1704-0 and/or 1704-i in FIG. 17A. The very particular decoder 1750 of FIG. 17B can decode three input bits (R2 to R0) into eight output bits (RDEC1-0 to RDEC1-7). One skilled in art could arrive at other decoding schemes for larger numbers of input bits.

It is noted that a pre-encoder 1700 can result in a relatively small area increase for a ternary CAM device. Still further, it is noted that a decoder in a DIRPE ×K case, like that shown as 1704-1 to 1704-i and 1750 in the above examples, may utilize existing decoding circuitry already present in a CAM device, such as address pre-decoders utilized for accessing CAM entries for read/write operations. In such an arrangement, only additional multiplexer circuits, or the like may be needed. As but one example, an input multiplexer could switch between CAM address values (e.g., either input or predecoded) and portion of search key value. An output multiplexer could switch resulting outputs between further decoding sections (e.g., row drivers, further decoders) and compare data inputs to a CAM array.

In this way, with relatively little additional circuitry, a CAM device can pre-encode key values to generate "one-hot" input values for search key portions appropriate for entries such as those generated according to the DIRPE ×K methods above.

DIRPE ×K Multiple Search Embodiments

In cases where a CAM device can provide search rates at a higher speed than that needed by a particular application, DIRPE ×K type rules can be divided into multiple sections (or levels), with each such section occupying an entry. In this way, relatively large bit sized DIRPE ×K entries can be spread over multiple smaller bit sized entries. In such an arrangement, each section can include a number of bits that identify the level of the section.

To better understand CAM entries according to such a multiple search embodiments, specific examples will now be described.

FIGS. 18A to 18C illustrate a case in which DIRPE ×K rules can be sectioned into multiple entries. FIG. 18A shows nine rules generated according to a DIRPE ×K case according to 4/3/3/3/3 encoding (i.e., K1=4, K2=K3=K4=K5=3). The nine rules can include 2^4+2^3+2^3+2^3+2^3=48 bits. Each rule includes a lowest defining section, which contains the lowest level containing significant information with respect to the range portion represented. The lowest defining section for each rule is circled in FIG. 18A.

FIG. 18B is a table showing a binary representation of each rule shown with respect to the range bits encoded in FIG. 18A. "Fixed" portions of such rules are shown by darkened lines. Fixed portions are those bit values that do not change for the portion of the range represented by the rule. FIG. 18C shows how the rules of FIG. 18A can be represented by new entries of smaller bit width, where such entries are searched by a sequence of search operations. Each new entry rule can include a level value LVL, which corresponds to the lowest defining section of a rule. As would be understood with reference to FIGS. 18A and 18B, each rule further includes its lowest defining section value (circled portion of FIG. 18A) as well as the fixed portions of the range bits for the rule (darkened line portion of FIG. 18B). Because, the sections 2^K2, 2^K3, 2^K4, and 2^K5 have fewer bits than section 2^K1 (i.e., 8 versus 16), entries for these sections can have "dummy" bits 1800 with "don't care" values.

It is understood that in a search operation for a rule set like that of FIG. 18B, each search will include five consecutive searches, each with a corresponding level bit value and portions of the range bits (in this case portions K1-K4). It is also understood that some additional logic operations can be utilized to establish priority among matching results.

As but one example, such multiple search entries can be entered such that a highest priority rule has a lowest physical address. In such an event, among the generated multiple match results, that with the lowest address can be selected as the "winning" match.

In this way, DIRPE ×K rules can be divided and stored in smaller width entries along with additional level ID bits.

Simulations were executed utilizing randomly generated range values over a 16-bit range space to compare various multiple search variations.

Figures 19A, 19B:
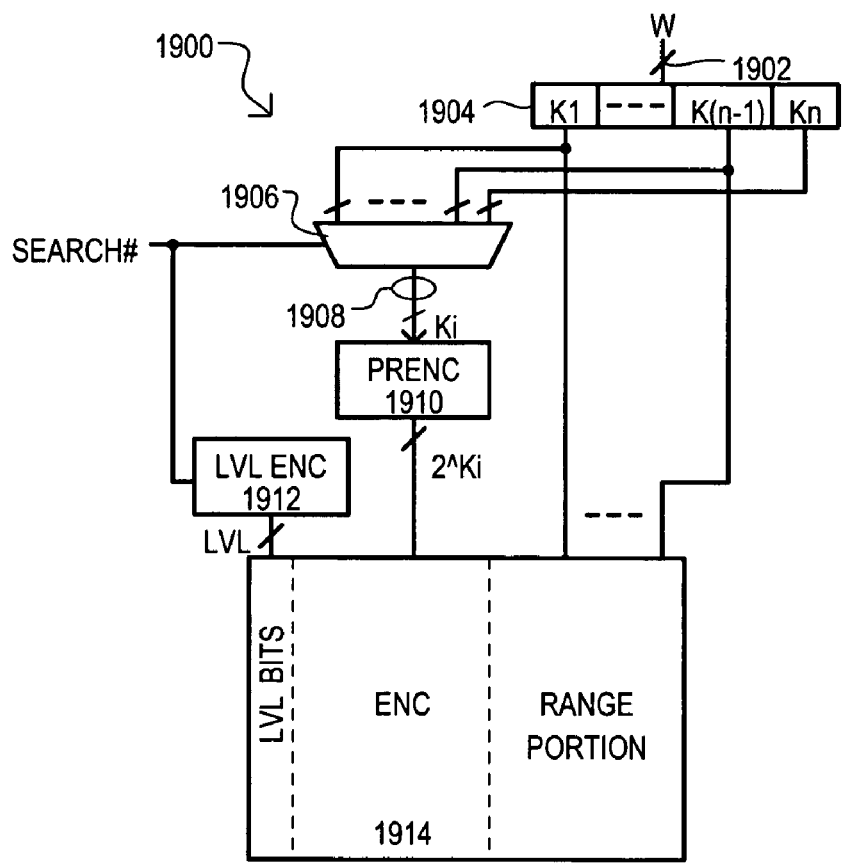
FIG. 19A is a table comparing range rule results for a conventional approach versus those of various embodiments of the present invention.
FIG. 19B is a block schematic diagram of a CAM device according to one embodiment.
Figures 20A, 20B, 21:
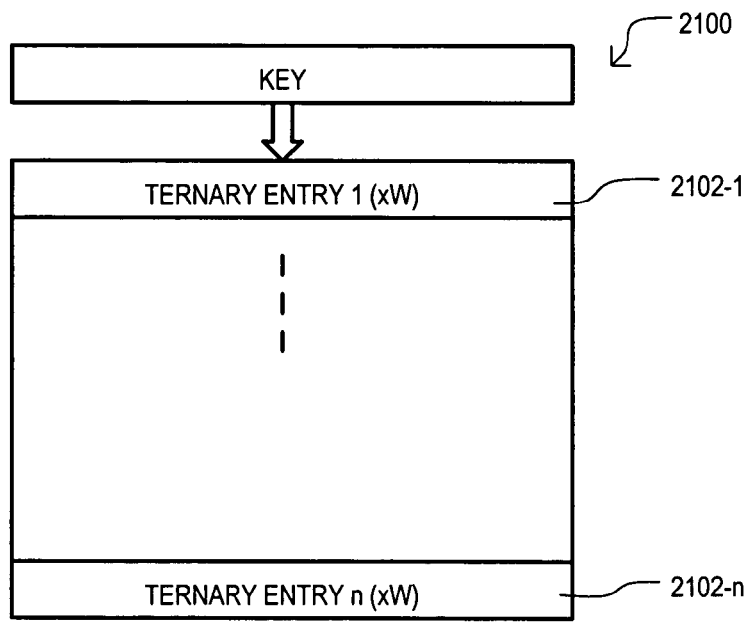
FIGS. 20A and 20B are tables showing conventional prefix enumeration encoding.
FIG. 21 is a block schematic diagram of a conventional CAM device.

Results of such simulations are set forth in a table in FIG. 19A. FIG. 19A provides a comparison of simulation results for range values on a 16 bit range space. FIG. 19A provides results for a conventional prefix enumeration approach (1 BIT at a time), and various DIRPE ×K multiple search approaches: 4/3/3/3/3, 4/4/4/4, 6/5/5 and 1/5/5/5.

The table of FIG. 19A shows the number of searches needed to fully examine each rule group. The table also shows the number of extra bits per entry (assuming 4 level ID bits), as well as a resulting expansion factor.

As shown by comparing FIG. 16 to FIG. 19A, a multiple search case does not necessarily translate to either a better or worse case. In addition, it is also noted that the 1/5/5/5 case is understood to be a DIRPE ×K-MSB type case. The three searches are executed on three sections of 2^5 bits (not including level ID bits), with a range being expressed by two "open ended" rule sets if it falls within a 0-1 transition of the MSB of the range space.

In this way, a DIRPE ×K range compression approach can be utilized in smaller bit width CAM entries by placing different encoded sections of resulting rules into their own CAM entry along with level ID bits that indicate the section's position with respect to the other sections of the rules.

Referring now to FIG. 19B, one particular example of a CAM device that can provide multiple search capabilities. A CAM device 1900 can include an input 1902 that receives a search key having W range bits. Such range bits can be stored in a register 1904. Portions (K1 to Kn) of range bits W can be selectively output with a multiplexer 1906 according to a search number value SEARCH#. Portions (K1 to Kn) output from multiplexer 1906 (Ki) can be applied to a preencoder 1910. A preencoder 1910 can provide "one-hot" encoding as described above. Further, in the event portions (K1 to Kn) do not have an equal number of bits, preencoder can insert "dummy" bits as either input values or output values, as noted in FIG. 18C.

A CAM device 1900 can also include a level encoder 1912 that can generate level bits. In the very particular arrangement of FIG. 19B, a level encoder 1912 can generate level bits according to a search number value SEARCH#.

A CAM device 1900 can include a CAM array 1914. Such a CAM array 1914 can include entries having encoded bits ENC, level bits LVL BITS, and portions of range bits according to the arrangement illustrated in FIG. 18C. It is noted that a devices and methods according to the disclosed embodiments may be particularly compatible with systems the provide packet processing, such as those utilizing access control lists (ACLs). In such an application, a CAM can accommodate random or pseudo-random varying range values rapidly, and with relatively little additional hardware. Further, such rapid range matching capabilities do not require pre-existing knowledge of an ACL database.

It is also understood that while it can be particularly advantageous to include encoding hardware described above on the same substrate as part of a CAM device, the present invention should not be limited to such an application. Alternate embodiments may include such circuits as on portion of a multi-chip package, or execute such operations with processor, or the like.

Figure 24:
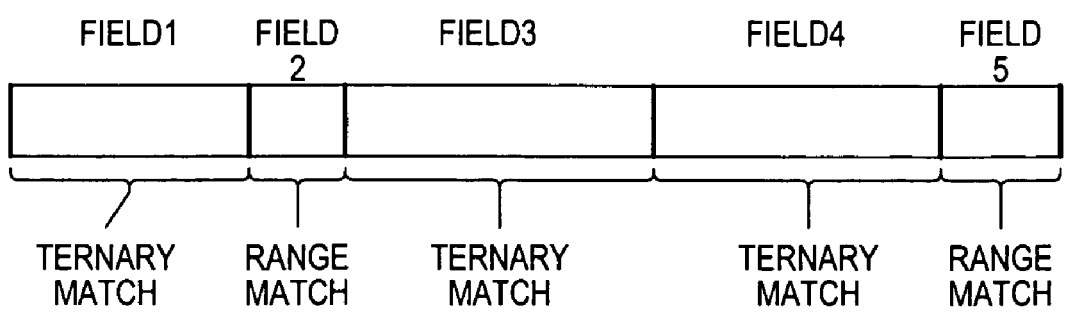
FIG. 24 is a diagram showing an example of a search key that includes both ternary and range matching fields.

Further, while the embodiments have shown arrangements that can encode one range field, it is understood that the present invention also includes arrangements that encode multiple range fields, such as the example shown in FIG. 24. In such a case, multiple encoders may be employed to provide multiple range field encoding in parallel. Alternatively, provided compare operations are sufficient fast, multiple range fields can be multiplexed between one encoder.

It is understood that the embodiments of the invention may be practiced in the absence of an element and or step not specifically disclosed. That is, an inventive feature of the invention can be elimination of an element.

Still further, while the above embodiments have described generation of rules according to a standard binary sequence, the present invention could be utilized for other sequences, such as "grey" code, as but one example. In such an arrangement, range compression may occur along a different type of bit transition.

Along these same lines, while the above examples have expressed CAM entry (e.g., range rule sets) in which bits are arranged in a particular direction, such examples should not be construed as limiting the invention thereto. As but a few particular examples, in the case of DIRPE ×2 encoding, within CAM entries, LO and/or HI bound bits could be interspersed with range value bits and/or each other, with the encoded key values being applied accordingly. Similarly, various sections of a DIRPE ×K case are not limited to any particular arrangement within a CAM entry (or entries), needing only to correspond to the order at which search keys are applied.

Accordingly, while the various aspects of the particular embodiments set forth herein have been described in detail, the present invention could be subject to various changes, substitutions, and alterations without departing from the spirit and scope of the invention.

What is claimed is:

1. A method for generating ternary content addressable memory entries to represent a search range, comprising the steps of:
    generating range code values to represent the search range, the range code values comprising at least a prefix that includes a plurality of bit values;
    compressing range code values based on the values varying from one another by predetermined least significant bit values into one range code value; and
    adding an extra bit to the compressed range code value to indicate the compressed range code value.

2. The method of claim 1, wherein:
    the step of compressing range code values includes determining if the last two bit values of a first range code value prefix are "01",
        a next higher range code value prefix matches all bits of higher significance than the last two bits of the first range code value prefix,
        the two bits of the next higher range code value prefix corresponding to the last two bits of the first range code value prefix are "1X", and
        generating a compressed range code value to represent the first and next higher range code values, the compressed range code value being the same as the first range code value, except for the last two bits of the prefix of the compressed range code value being changed to "XX"; and
    the step of adding an extra bit to the compressed range code value includes setting an extra low bound bit to "1" that corresponds to the two bit values changed from 01 to XX, where a bit value of X represents a masked or a "don't care" value.

3. The method of claim 1, wherein:
    the step of compressing range code values includes determining if the last two bit values of a first range code value prefix are "10",
        a next lower range code value prefix value matches all bits of higher significance than the last two bits of the first range code value prefix,
        the two bits of the next lower range code value prefix corresponding to the last two bits of the first range code value prefix are "0X", and
        generating a compressed range code value to represent the first and next lower range code values, the compressed range code value being the same as the first range code value, except for the last two bits of the prefix of the compressed range code value being changed to "XX"; and
    the step of adding an extra bit to the compressed range code value includes setting an extra high bound bit to "1" that corresponds to the two bit values changed from 10 to XX, where a bit value of X represents a masked or a "don't care" value.

4. The method of claim 1, wherein:
    the bits of the compressed range code value have an order of increasing significance with respect to one another; and
    the step of adding an extra bit to the compressed range code value includes adding E bits to each compressed range code value, where E is an integer, each of the E bits corresponding to two bit locations adjacent to one another in the order of significance and representing a compressed range code generated by compressing two range codes that vary from one another at the two bit locations.

5. The method of claim 4, wherein:
    the number of bits in the range code values is W, where W is an integer; and
    E is equal to at least ½W, each E bit representing non-overlapping two bit locations beginning with the least significant two bit locations.

6. The method of claim 5, wherein:
    E is no more than W, and includes
    a lower bound group of L=W/2 bits that indicates when bit values are compressed to represent a lower bound limitation in the range, and
    an upper bound group of H=W/2 bits that indicates when bit values are compressed to represent an upper bound limitation in the range.

7. The method of claim 4, wherein:
    number of bits in the range code values is W, where W is an integer; and
    E is equal to at least W−1, each E bit representing overlapping two bit locations beginning with the least significant two bit locations.

8. The method of claim 7, wherein:
    E is no more than 2(W−1), and includes
    a lower bound group of L=W−1 bits that indicates when bit values are compressed to represent a lower bound limitation in the range, and
    an upper bound group of H=W−1 bits that indicates when bit values are compressed to represent an upper bound limitation in the range.

9. A method for generating search key values for a range rule search in a ternary content addressable memory (CAM), comprising the steps of:
- logically combining bit pairs of an original search key value to generate encoded bits in addition to the bits of the original search key value, each encoded bit being generated from no more than two original search key bits; and
- applying the bits of the original search key value in parallel with the encoded bits to entries of the ternary CAM, the bits of the original search key being applied to first portions of the ternary CAM entries, the encoded bits being applied to second portions of the ternary CAM entries, the second portions having different bit locations than the first portions.

10. The method of claim 9, wherein:
the step of logically combining bit pairs includes logically ORing each bit pair with circuits on the ternary CAM.

11. The method of claim 9, wherein:
the step of logically combining bit pairs includes logically NANDing each bit pair with circuits on the ternary CAM.

12. The method of claim 9, wherein:
the step of logically combining bit pairs includes logically combining bit pairs in a non-overlapping manner beginning with the least significant bit pair.

13. The method of claim 12, wherein:
the number of bits in the search key is W, where W is an integer; and
the step of logically combining bit pairs includes logically combining non-overlapping adjacent bit pairs beginning with the least significant bit pair to generate
½W encoded bits that are applied to additional bits of the entries that represent lower boundary compression, and
½W encoded bits that are applied to additional bits of the entries that represent higher boundary compression.

14. The method of claim 9, wherein:
the step of logically combining bit pairs includes logically combining bit pairs in an overlapping manner beginning with the least significant bit pair.

15. The method of claim 14, wherein:
the number of bits in the search key is W, where W is an integer; and
the step of logically combining bit pairs includes logically combining overlapping adjacent bit pairs beginning with the least significant bit pair to generate
W−1 encoded bits that are applied to additional bits of the entries that represent lower boundary compression, and
W−1 encoded bits that are applied to additional bits of the entries that represent higher boundary compression.

16. A ternary content addressable memory (CAM) device, comprising:
- a compare data input that receives search key values that include W bits, where W is an integer;
- at least a first encoder for logically combining bit pairs of the search key value to generate E additional bits, where E is an integer, the first encoder generating each of the E additional bits from no more than one bit pair of the search key value; and
- at least one ternary CAM array having entries of M-bit width coupled to receive the W bits of the search key in parallel with the E additional bits, with M being greater than or equal to W+E.

17. The ternary CAM device of claim 16, wherein:
the at least first encoder comprises a plurality of first logic gates that logically OR bit pairs of the search key value.

18. The ternary CAM device of claim 16, wherein:
the at least first encoder comprises a plurality of second gates that logically NAND bit pairs of the search key value.

19. The ternary CAM device of claim 16, wherein:
the bits of the search key value have an order of increasing significance with respect to one another; and
the at least first encoder logically combines bit pairs adjacent to one another in the order of significance in a non-overlapping manner to generate two additional bit values for each bit pair of the search key, such that E=W.

20. The ternary CAM device of claim 16, wherein:
the bits of the search key value have an order of increasing significance with respect to one another; and
the at least first encoder logically combines bit pairs adjacent to one another in the order of significance in an overlapping manner to generate two additional bit values for each bit pair of the search key, such that E=2(W−1).

* * * * *